(12) United States Patent
Eto

(10) Patent No.: US 9,269,173 B2
(45) Date of Patent: Feb. 23, 2016

(54) INTERCOMPONENT PHYSICAL PROPERTY TRANSFER DETERMINATION DISPLAY APPARATUS AND METHOD

(71) Applicant: SOFTWARE CRADLE CO., LTD., Osaka-shi, Osaka (JP)

(72) Inventor: Jun Eto, Osaka (JP)

(73) Assignee: SOFTWARE CRADLE CO., LTD., Osaka-Shi, Osaka (JP)

( * ) Notice: Subject to any disclaimer, the term of this patent is extended or adjusted under 35 U.S.C. 154(b) by 0 days.

(21) Appl. No.: 14/511,312

(22) Filed: Oct. 10, 2014

(65) Prior Publication Data

US 2015/0116332 A1 Apr. 30, 2015

(30) Foreign Application Priority Data

Oct. 24, 2013 (JP) ................................. 2013-220725

(51) Int. Cl.
*G06T 11/20* (2006.01)
*G06F 17/50* (2006.01)

(52) U.S. Cl.
CPC .......... *G06T 11/206* (2013.01); *G06F 17/5081* (2013.01)

(58) Field of Classification Search
CPC .................................................... G06T 11/206
See application file for complete search history.

(56) References Cited

U.S. PATENT DOCUMENTS

| 5,311,448 A | * | 5/1994 | Waggoner et al. ............... 703/13 |
| 2005/0125174 A1 | * | 6/2005 | Nam et al. ....................... 702/65 |
| 2005/0289497 A1 | | 12/2005 | Matsumoto |

FOREIGN PATENT DOCUMENTS

| JP | 2002-304422 | 10/2002 |
| JP | 2006-012049 | 1/2006 |
| JP | 2006-018517 | 1/2006 |
| JP | 2006-350504 | 12/2006 |

OTHER PUBLICATIONS

SolidWorks Flow Simulation 2012 Tutorial, 2012.*

* cited by examiner

*Primary Examiner* — Weiming He
(74) *Attorney, Agent, or Firm* — Troutman Sanders LLP

(57) ABSTRACT

An information processing apparatus includes: a resistance value acquiring unit that acquires a resistance value of at least one component corresponding to a physical quantity that is transmitted between two components, using inter-component information having component identifiers respectively indicating two components; a display information generating unit that generates, using the inter-component information, display information for displaying a transmission path diagram, which is an image showing a transmission path having nodes respectively associated with at least two components, and is an image in which information indicating the resistance value acquired by the resistance value acquiring unit is arranged at a node associated with at least one component from which the resistance value has been acquired; and an output unit that outputs the display information generated by the display information generating unit.

15 Claims, 29 Drawing Sheets

| Component ID | Component name | Contact component ID | Surface temperature | Amount of heat transmitted |
|---|---|---|---|---|
| 011 | j | 012 | 59.04026 | 0.163086 |
| 011 | j | 013 | 58.922722 | 0.163572 |
| 011 | j | 014 | 59.189182 | 0.043406 |
| 011 | j | 015 | 59.258411 | 0.130333 |
| 011 | j | 016 | 58.975525 | 0.119326 |
| 011 | j | 017 | 59.076538 | 0.130056 |
| 011 | j | 018 | 59.132557 | 0.042783 |
| 011 | j | 019 | 58.966076 | 0.086907 |
| 011 | j | 020 | 58.842335 | 0.119962 |
| 012 | h | 011 | 59.04026 | −0.163086 |
| 012 | h | 014 | 59.173069 | 0.218499 |
| 012 | h | 016 | 59.028473 | −0.016361 |
| 012 | h | 017 | 59.100189 | −0.039029 |
| 013 | i | 011 | 58.922722 | −0.163572 |
| 013 | i | 015 | 59.041504 | 0.210509 |
| 013 | i | 019 | 58.992401 | −0.004870 |
| 013 | i | 020 | 58.900764 | −0.041975 |
| 014 | b | 011 | 59.189182 | −0.043406 |
| ⋮ | ⋮ | ⋮ | ⋮ | ⋮ |
| 015 | a | 011 | 59.258411 | −0.130333 |
| 015 | a | 013 | 59.252029 | −0.210509 |
| 015 | a | 014 | 59.208961 | −0.343832 |
| 015 | a | 017 | 59.218716 | −0.081158 |
| 015 | a | 018 | 59.235855 | −0.172719 |
| 015 | a | 019 | 59.249470 | −0.061276 |
| 016 | f | 011 | 58.975525 | −0.119326 |
| ⋮ | ⋮ | ⋮ | ⋮ | ⋮ |
| 017 | g | 011 | 59.076538 | −0.130056 |
| ⋮ | ⋮ | ⋮ | ⋮ | ⋮ |
| 018 | c | 011 | 59.132557 | −0.042783 |
| ⋮ | ⋮ | ⋮ | ⋮ | ⋮ |
| 019 | d | 011 | 58.966076 | −0.086907 |
| ⋮ | ⋮ | ⋮ | ⋮ | ⋮ |
| 020 | e | 011 | 58.842335 | −0.119962 |
| ⋮ | ⋮ | ⋮ | ⋮ | ⋮ |

FIG.8

| Group ID | Component ID |
|---|---|
| G1 | 014 |
| G1 | 015 |
| G2 | 016 |
| G2 | 017 |
| G3 | 018 |
| G3 | 019 |
| G3 | 020 |

FIG.9

| Component ID | Component temperature | Heat source | Maximum temperature |
|---|---|---|---|
| 011 | 20.806492 | 0 | 57.905457 |
| 012 | 59.072472 | 0 | 59.165585 |
| 013 | 58.951637 | 0 | 59.041073 |
| 014 | 59.189903 | 0 | 59.209305 |
| 015 | 59.258293 | 1 | 59.283333 |
| 016 | 58.998398 | 0 | 59.051342 |
| 017 | 59.104187 | 0 | 59.223236 |
| 018 | 59.159649 | 0 | 59.228352 |
| 019 | 59.010761 | 0 | 59.215801 |
| 020 | 58.861530 | 0 | 58.917557 |

FIG.10

| Component ID | Transmission destination ID | Transmission destination-side surface temperature | Actual amount of heat transmitted |
|---|---|---|---|
| 012 | 011 | 59.04026 | 0.163086 |
| 012 | 016 | 59.028473 | 0.016361 |
| 012 | 017 | 59.100189 | 0.039029 |

FIG.11

| Component ID | Heat resistance value |
|---|---|
| 012 | 1.60 |
| 013 | 1.30 |
| 014 | 0.28 |
| 015 | 0.26 |
| 016 | 0.42 |
| 017 | 0.21 |
| 018 | 1.49 |
| 019 | 3.20 |
| 020 | 0.36 |

FIG.12

| Group ID | Heat resistance value |
|---|---|
| G1 | 0.297329 |
| G2 | 1.739578 |
| G3 | −2.587523 |
| 012 | 1.60 |
| 013 | 1.30 |

FIG.14

| Component ID | Contact component ID | Amount of heat transmitted |
|---|---|---|
| 012 | G1 | 0.218499 |
| 012 | G2 | −0.016361 |
| 012 | G2 | −0.039029 |
| 013 | G1 | 0.210509 |
| 013 | G3 | −0.004870 |
| 013 | G3 | −0.041975 |
| G1 | 012 | −0.218499 |
| ⋮ | ⋮ | ⋮ |

FIG.15

| Group ID | Contact group ID | Summed amount of heat transmitted |
|---|---|---|
| 012 | G1 | 0.218499 |
| 012 | G2 | −0.0553897 |
| 013 | G1 | 0.210509 |
| 013 | G3 | −0.0468451 |
| G1 | G2 | −0.162998 |
| G1 | G3 | −0.233995 |
| G1 | 012 | −0.218499 |
| G1 | 013 | −0.210509 |
| G2 | G1 | 0.162998 |
| G2 | G3 | 0.0310478 |
| G2 | 012 | 0.0553897 |
| G3 | G1 | 0.233995 |
| G3 | G2 | −0.0310478 |
| G3 | 013 | 0.0468451 |

FIG.16

| Component ID | Volume | Surface area |
|---|---|---|
| 012 | 0.999992 | 5.00001 |
| 013 | 0.999994 | 5 |
| 014 | 0.499997 | 3.5 |
| 015 | 1.499999 | 6.50001 |
| 016 | 0.499997 | 3.5 |
| 017 | 1.49999 | 6.5 |
| 018 | 0.499998 | 3.5 |
| 019 | 0.999994 | 5 |
| 020 | 0.499998 | 3.5 |

FIG.20

INTERCOMPONENT PHYSICAL PROPERTY TRANSFER DETERMINATION DISPLAY APPARATUS AND METHOD

CROSS REFERENCE TO RELATED APPLICATION

This application claims priority under 35 U.S.C. §119 to Japanese Patent Application No. 2013-220725, filed on Oct. 24, 2013, the entire content of which being hereby incorporated herein by reference.

FIELD OF THE INVENTION

The present invention relates to an apparatus and the like for outputting information indicating a transmission situation of a physical quantity between multiple components.

BACKGROUND

As a conventional technique, there is a known analysis result display method, including: a heat transfer amount calculating step of calculating a heat transfer amount between multiple components forming an object, from an analysis result obtained by performing numerical analysis on that object; and a heat transfer amount display step of displaying heat transfer obtained in the heat transfer amount calculating step. See, for example, JP 2006-350504A, page 1 and FIG. 1.

However, such a conventional technique is problematic in that, although the heat transfer direction between components and the amount of heat transferred can be displayed, a transmission situation of a physical quantity such as heat between the components forming the physical quantity transmission path cannot be properly displayed. For example, whether or not each component can easily transmit a physical quantity cannot be properly displayed to a user. Accordingly, for example, the user cannot easily see which component obstructs proper transmission of the physical quantity.

SUMMARY

The present invention was arrived at in order to solve the above-described problems, and it is an aspect thereof to provide an information processing apparatus that can properly display a transmission situation of a physical quantity between components on a physical quantity transmission path.

The present invention is directed to an information processing apparatus, including: an inter-component information storage unit in which multiple pieces of inter-component information, each of which is information having component identifiers respectively indicating two components, a value of a physical quantity that is transmitted between the two components, and a state value, with respect to the two components, that changes according to transmission of the physical quantity, are stored; a resistance value acquiring unit that acquires a resistance value of at least one component corresponding to the physical quantity, using the inter-component information; a display information generating unit that generates, using the inter-component information, display information for displaying a transmission path diagram, which is an image showing a transmission path having nodes respectively associated with at least two components, and is an image in which information indicating the resistance value acquired by the resistance value acquiring unit is arranged at a node associated with at least one component from which the resistance value has been acquired; and an output unit that outputs the display information generated by the display information generating unit.

With this configuration, a transmission situation of a physical quantity between components on a physical quantity transmission path can be properly displayed.

Furthermore, according to the information processing apparatus of the present invention, the physical quantity is heat, the state value is a surface temperature of a component, and the resistance value is a heat resistance value of a component.

With this configuration, a transmission situation of heat between components on a heat transmission path can be properly displayed.

Furthermore, according to the information processing apparatus of the present invention, the information processing apparatus further includes: a component temperature management information storage unit in which at least one piece of component temperature management information, which has at least one component identifier contained in the inter-component information, and component temperature information indicating a temperature of a component indicated by the component identifier, is stored; the display information generating unit acquires component temperature information corresponding to each of at least two components associated with at least two nodes on the transmission path, from the component temperature management information storage unit, and generates display information for a transmission path diagram in which a node associated with each component is arranged, in a coordinate system having two axes representing a component temperature and a component heat resistance value, at a position specified with a temperature of that component indicated by the component temperature information acquired for that component and a heat resistance value acquired for that component by the resistance value acquiring unit.

With this configuration, a transmission situation of a physical quantity between components, and a relationship between a component temperature and a heat resistance can be properly displayed.

Furthermore, according to the information processing apparatus of the present invention, the information processing apparatus further includes: a component temperature management information storage unit in which at least one piece of component temperature management information, which has at least one component identifier contained in the inter-component information, and component temperature information indicating a temperature of a component indicated by the component identifier, is stored; and a component size information storage unit in which at least one piece of component size information, which has at least one component identifier contained in the inter-component information, and at least one of surface area information indicating a surface area and volume information indicating a volume of a component indicated by the component identifier, is stored; the display information generating unit acquires component temperature information corresponding to each of at least three components associated with nodes on the transmission path, from the component temperature management information storage unit, further acquires component size information corresponding to each of at least two components forming nodes on the transmission path, from the component size information storage unit, and generates display information for a transmission path diagram in which a node associated with each component is arranged, in a coordinate system having two axes representing a component temperature and a component surface area or volume, at a position specified with a temperature of that component indicated by the component temperature information acquired for that component and a surface area or volume of that component indicated by the component size information acquired for that component.

With this configuration, a transmission situation of a physical quantity between components, and a relationship between a component temperature and a size can be properly displayed.

Furthermore, according to the information processing apparatus of the present invention, the display information generating unit detects a component having a high heat resistance value using heat resistance values of components associated with nodes on the transmission path acquired by the resistance value acquiring unit, and generates display information for a transmission path diagram in which a node associated with the detected component can be identified from other nodes.

With this configuration, a component having high heat resistance on a transmission path can be properly displayed.

Furthermore, according to the information processing apparatus of the present invention, the physical quantity is current, the state value is a potential of a component, and the resistance value is an electrical resistance value of a component.

With this configuration, a transmission situation of current between components on a current transmission path can be properly displayed.

Furthermore, according to the information processing apparatus of the present invention, the display information generating unit generates display information for a transmission path diagram in which each node on the transmission path is arranged, and two nodes respectively associated with two components between which the physical quantity is transmitted are connected to each other.

With this configuration, a transmission situation of a physical quantity between components on a physical quantity transmission path can be properly displayed.

Furthermore, according to the information processing apparatus of the present invention, the display information generating unit detects at least two components between which a large physical quantity is transmitted, and generates display information for a transmission path diagram in which a line connecting nodes associated with the at least two detected components has an appearance identifiable from lines connecting other components.

With this configuration, multiple components between which a large physical quantity is transmitted can be properly displayed, and a path on which a large physical quantity is transmitted can be properly displayed.

Furthermore, according to the information processing apparatus of the present invention, the display information generating unit detects a component having a low resistance value and not connected to either of the at least two components between which a large physical quantity is transmitted, and generates display information for a transmission path diagram in which the detected node can be identified from other nodes.

With this configuration, a component having a high heat radiation potential can be properly displayed.

Furthermore, according to the information processing apparatus of the present invention, the information processing apparatus further includes: a group management information storage unit in which at least one piece of group management information, which has a component identifier of at least one component belonging to one group, is stored; the resistance value acquiring unit acquires a resistance value of at least one group indicated by the group management information, using the inter-component information, and the display information generating unit generates display information for displaying a transmission path diagram in which a transmission path is shown where a node each indicating at least one group indicated by the group management information is arranged instead of a node of at least one component belonging to the group, and in which information indicating the resistance value acquired for each of at least one group on the transmission path by the resistance value acquiring unit is arranged at a node associated with that group.

With this configuration, a transmission situation of a physical quantity between component groups on a physical quantity transmission path can be properly displayed.

The information processing apparatus and the like according to the present invention can properly display a transmission situation of a physical quantity between components on a physical quantity transmission path.

BRIEF DESCRIPTION OF THE DRAWINGS

FIG. 8 is a diagram showing an inter-component information management table of the information processing apparatus in this Example.

FIG. 9 is a diagram showing a group management table of the information processing apparatus in this Example.

FIG. 10 is a diagram showing a component temperature management table of the information processing apparatus in this Example.

FIG. 11 is a diagram showing a transmission destination management table of the information processing apparatus in this Example.

FIG. 12 is a diagram showing a heat resistance value management table of the information processing apparatus in this Example.

FIG. 14 is a diagram showing a group heat resistance value management table of the information processing apparatus in this Example.

FIG. 15 is a diagram showing an inter-group information management table of the information processing apparatus in this Example.

FIG. 16 is a diagram showing a group heat transmission amount management table of the information processing apparatus in this Example.

FIG. 20 is a diagram showing a component size management table of the information processing apparatus in this Example.

DETAILED DESCRIPTION

Figure 1:
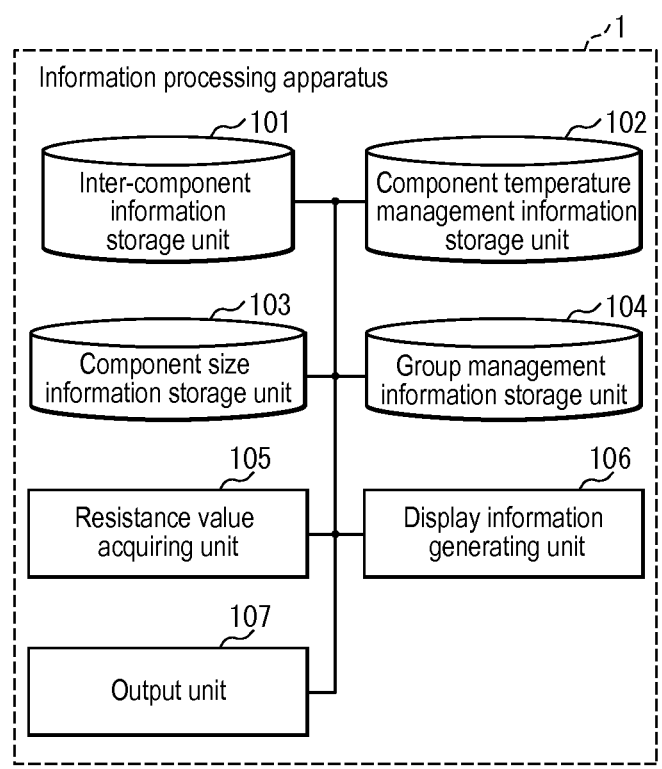
FIG. 1 is a block diagram of an information processing apparatus in Example of the present invention.

Hereinafter, examples of an information processing apparatus and the like will be described with reference to the drawings. Note that constituent elements denoted by the same reference numerals perform the same operations in the examples, and, thus, a description thereof may not be repeated.

EXAMPLE

FIG. 1 is a block diagram of an information processing apparatus in this Example.

An information processing apparatus 1 includes an inter-component information storage unit 101, a component temperature management information storage unit 102, a component size information storage unit 103, a group management information storage unit 104, a resistance value acquiring unit 105, a display information generating unit 106, and an output unit 107.

In the inter-component information storage unit 101, multiple pieces of inter-component information, preferably three or more pieces of inter-component information are stored. Each piece of inter-component information is information having component identifiers respectively indicating two components, a value of a physical quantity that is transmitted between the two components respectively indicated by the component identifiers, and a state value, with respect to the two components, that changes according to transmission of the physical quantity. The inter-component information is information acquired, for example, an experiment, a simulation, or the like.

A component forms, for example, part of a product, a finished product, or the like. Each component may be made of any material, and may have any shape. Note that the component in this example may not be a minimum constituent unit of a product, a finished product, or the like. For example, one component may be configured by multiple minimum constituent units. Furthermore, for example, one component may be configured by multiple components, and the multiple components may be in a hierarchical structure.

The component may be considered as a virtual component, such as a component in a three-dimensional model that is arranged in a virtual three-dimensional space created using CAD or the like. This virtual component may be, for example, a three-dimensional model used for performing a simulation or the like regarding physical quantity in computer aided engineering (CAE), design data for components, or the like. Furthermore, if the volume and the like of components do not have to be taken into consideration, the components may be, for example, data of two-dimensional components that are arranged in a virtual two-dimensional space. Furthermore, the components may be fluid such as gas (e.g., air) or liquid.

Two component identifiers contained in one piece of inter-component information are, for example, component identifiers of two components between which a physical quantity is transmitted. The two components between which a physical quantity is transmitted may be considered, for example, as components between which a physical quantity is directly transmitted. Furthermore, the two components between which a physical quantity is transmitted may be considered, for example, as two components between which a physical quantity is transmitted without being interrupted by another component that affects transmission of the physical quantity. Two component identifiers contained in each of two or more pieces of inter-component information may be considered, for example, as a combination of component identifiers of two components between which a physical quantity is transmitted, the two components being from among two or more, preferably three or more components contained in a component group.

Two component identifiers contained in one piece of inter-component information may be specifically component identifying information of two components that are connected to each other. The state in which two components are connected to each other is, for example, a concept that encompasses a state in which the components are in contact with each other without another component interposed therebetween, and a state in which the components are electrically connected to each other. Note that another component in this example may not refer to, for example, components whose influence on transmission of the physical quantity between two components is negligible, such as a wiring line whose resistance value is as low as negligible in a simulation or the like, or a soldering or adhesive agent whose heat resistance value is as low as negligible in a simulation or the like.

The component identifiers may be any identifiers with which components can be identified. The component identifiers are, for example, component names, code allocated to components, or the like. Alternatively, in a case where a simulation or the like is performed on components, they may be identifiers such as model names corresponding to models associated with the components.

The physical quantity that is transmitted between components is, for example, heat, current, or the like. The inter-component information may have values of two or more physical quantities. The value of a physical quantity may be an actually measured value, or may be a value of a physical quantity acquired by performing a simulation on multiple components. Furthermore, it may be a theoretical value, an estimated value, or the like. Note that the same is applied to a state value and the like described later.

The value of a physical quantity that is transmitted between components is, for example, a value indicating a physical quantity that is transmitted from one to the other of the two components respectively indicated by two component identifiers. Furthermore, the value of a physical quantity that is transmitted between components may be values respectively indicating physical quantities that are transmitted between two components respectively indicated by two component identifiers, or may be a value indicating a difference between physical quantities that are transmitted between the components. This difference may be considered as a value obtained by compositing values of physical quantities. Furthermore, the value of a physical quantity that is transmitted between components may be any information, for example, enabling acquisition of the value of the physical quantity that seems to be transmitted from one to the other of the two actual components.

The physical quantity that is transmitted between components is stored in the inter-component information, for example, such that a transmission direction of a physical quantity can be recognized. For example, the value of the physical quantity that is transmitted between components may be indicated while taking, as either a positive direction or a negative direction, the transmission direction from one to the other of the components respectively indicated by two component identifiers. Furthermore, for example, the inter-component information may have information indicating a link direction between the components, that is, a transmission direction of a physical quantity. Furthermore, the inter-component information may have, as two component identifiers, a component identifier associated with information indicating a transmission source component of the physical quantity that is transmitted and a component identifier associated with information indicating a transmission destination component.

In the description below, in a case where two components between which the physical quantity is transmitted are taken as a first component and a second component, and a first physical quantity, which is a physical quantity that is transmitted from the first component to a second component, is larger than the second physical quantity, which is a physical quantity that is transmitted from the second component to the first component, the first component is referred to as a transmission source component and the second component is referred to as a transmission destination component.

Furthermore, a difference between the first physical quantity and the second physical quantity is referred to as an actual transmission physical quantity because this value seems to correspond to a physical quantity that is actually transmitted. The sign of the actual transmission physical quantity is determined, for example, whether the transmission of the physical quantity from the first component to the second component is taken as positive or negative. If the value of the second physical quantity is 0, the first physical quantity may be considered as the actual transmission physical quantity, and the first physical quantity may be used as the actual transmission physical quantity. The actual transmission physical quantity may be considered as a physical quantity that is as a result transmitted between components.

The state value is a value indicating a state of a component, which changes according to transmission of the physical quantity. The state value is, for example, a state value of a component at a portion thereof where the physical quantity is transmitted, for example, a portion from which the physical quantity is output, or a portion to which the physical quantity is input. The state value is, for example, a surface temperature of a component, which changes according to transmission of heat. For example, the state value is a surface temperature on contact faces of two components that are in contact with each other, which changes according to transmission of heat between the components.

Note that, although contact faces of two components typically have the same temperature if the components are in contact with each other, the contact faces may have different temperatures if there is contact heat resistance at the contact faces. Accordingly, since two faces that are in contact with each other may have different surface temperatures, if the state value is set to a surface temperature, the inter-component information preferably has, as the state value, a surface temperature on each of the contact faces of the two components that are in contact with each other. Note that one piece of inter-component information does not have to have the state values on both contact faces of two components that are in contact with each other, and may have only the state value on either one of the contact faces of the components. Furthermore, if the contact heat resistance is not taken into consideration, the inter-component information may have, as the state value, only a surface temperature on one of the contact faces of two components that are in contact with each other, assuming that the two faces that are in contact with each other have the same surface temperature, and the surface temperature of this one component may be considered as the surface temperature on both of the contact faces of the two components that are in contact with each other. Also, two components that are in contact with each other via an adhesive or the like, which is not taken into consideration as a component, may be considered as being in contact with each other.

Furthermore, the state value may be, for example, a value indicating a potential of a component, which changes according to transmission of current. The state value may be, for example, a potential of connection portions (not shown) of two components, which changes according to transmission of current between the components that are connected to each other.

Note that a combination of the physical quantity and the state value contained in the inter-component information may be those other than the combination of the heat and the surface temperature and the combination of the current and the potential described above, as long as it is a combination of a physical quantity and a state value that changes according to a change in this physical quantity.

The inter-component information is, for example, information at least having a component identifier of a transmission source component of a physical quantity, a component identifier of a transmission destination component to which the physical quantity is transmitted from the transmission source component, a value of an actual transmission physical quantity that is transmitted from the transmission source component to the transmission destination component, and a state value of the transmission source component at a portion thereof connected to the transmission destination component. The value of the physical quantity is represented, for example, by a value in the case where the transmission direction from the transmission source component to the transmission destination component, of components indicated by two identifiers contained in the inter-component information, is taken as a positive direction.

Note that one component may be connected to two or at least three components. In this case, multiple pieces of inter-component information having one common component identifier may be stored in the inter-component information storage unit 101. For example, inter-component information regarding a component A and a component B, inter-component information regarding the component B and a component C, and inter-component information regarding the component C and a component D may be stored in the inter-component information storage unit 101.

Multiple pieces of inter-component information of the present invention may be any information enabling acquisition of information used by the resistance value acquiring unit 105 (described later) for acquiring a resistance value of a component. The resistance value is, for example, a resistance value in a state where a component has been arranged on a transmission path. For example, the inter-component information may be any information enabling acquisition of a value of an actual transmission physical quantity that is transmitted from a component from which a resistance value is to be acquired (hereinafter, referred to as an "acquisition object component") to each of one or at least two transmission destination components that are connected to the acquisition object component, a state value of the acquisition object component at a portion thereof connected to each of the one or at least two transmission destination components, and a state value of the acquisition object component at a portion thereof connected to each of one or two transmission source components from which the physical quantity is transmitted to the acquisition object component.

Multiple pieces of inter-component information stored in the inter-component information storage unit 101 may be any information capable of as a result indicating a value of a physical quantity that is transmitted between two components, and a state value, with respect to the two components, that changes according to transmission of the physical quantity, for three or more components, and there is no limitation on how the information is contained. For example, the multiple pieces of inter-component information may be information including one or more groups of one component identifier; one or at least two component identifiers respectively indicating one or at least two components subjected to transmission of a physical quantity with a first component indicated by the one component identifier; a value of the physical quantity that is transmitted between the first component and each of the one or at least two components; and a state value, with respect to the first component and each of the one or at least two components, that changes according to transmission of the physical quantity.

The inter-component information may be, for example, such that two component identifiers, a value of a physical quantity that is transmitted between two components respectively indicated by the component identifiers, and a state value, with respect to at least one of the two components respectively indicated by the component identifiers, that changes according to transmission of the physical quantity can be acquired only with one piece of inter-component information, or such that two component identifiers, a value of a physical quantity that is transmitted between two components respectively indicated by the component identifiers, and a state value, with respect to at least one of the two components respectively indicated by the component identifiers, that changes according to transmission of the physical quantity can be acquired by combining multiple pieces of inter-component information.

Furthermore, one piece of inter-component information may be configured by multiple pieces of information. For example, an information pair of two component identifiers and a value of a physical quantity that is transmitted between two components respectively indicated by the component identifiers, and an information pair of the same two component identifiers and a state value, with respect to a component indicated by at least one of the component identifiers, that changes according to transmission of the physical quantity may be considered as one piece of inter-component information. Furthermore, there is no limitation on the data structure and the like of the inter-component information.

Furthermore, in the inter-component information storage unit 101, information in which a component identifier of a component functioning as a physical quantity generating source such as a heat generating source (e.g., a heat source or a power source) and information indicating that this component is the generating source are associated with each other may be further stored. Furthermore, this information may further have information on a value of a physical quantity of the component, such as heat or current generated inside the component, and information on a potential or the like of the component. Note that the inter-component information having a component identifier of a component functioning as the physical quantity generating source may contain the value of the physical quantity such as heat generated inside the component such that this value is associated with the component identifier of the component functioning as the generating source.

The storing in this example is a concept that encompasses temporarily storing. The inter-component information storage unit 101 is preferably a non-volatile storage medium, but may be realized also by a volatile storage medium. Note that the same is applied to the description below.

In the component temperature management information storage unit 102, one or at least two pieces of component temperature management information are stored. The component temperature management information has one or more component identifiers contained in the inter-component information, and component temperature information of components indicated by the component identifiers. The component temperature information is information indicating a temperature of a component, and is, for example, information indicating a temperature inside a component (e.g., at a center portion thereof). For example, the component temperature information is a temperature value. The component temperature information may be an actually measured value, or may be a simulated value or the like. Furthermore, the component temperature management information may have information indicating a maximum temperature of a component, and information indicating whether or not a component is a heat generating source (e.g., whether or not a component is a heat source) and the like. Note that the component temperature management information storage unit 102 may be omitted if the information stored in the component temperature management information storage unit 102 is not used for generating display information (described later) or the like.

In the component size information storage unit 103, one or more pieces of component size information are stored. The component size information has one or more component identifiers contained in the inter-component information, and at least one of surface area information indicating a surface area and volume information indicating a volume of components indicated by the component identifiers. The surface area information is, for example, a surface area value of a component. Furthermore, the volume information is a volume value of a component. Note that the component size information storage unit 103 may be omitted if the information stored in the component size information storage unit 103 is not used for generating display information (described later) or the like.

In the group management information storage unit 104, one or more pieces of group management information are stored. One piece of group management information has component identifiers of one or at least two components belonging to one group. One or at least two component identifiers contained in the group management information are typically component identifiers contained in the inter-component information. The group management information may further have a group identifier, which is an identifier of a group. Note that all component identifiers contained in the inter-component information stored in the inter-component information storage unit 101 do not necessarily have to belong to any group. That is to say, all component identifiers contained in the inter-component information stored in the inter-component information storage unit 101 do not have to be contained in any piece of group management information.

The resistance value acquiring unit 105 acquires a resistance value of one or at least two components corresponding to the physical quantity, using the multiple pieces of inter-component information stored in the inter-component information storage unit 101. The resistance value acquiring unit 105 acquires a resistance value of one or at least two components indicated by the multiple pieces of inter-component information stored in the inter-component information storage unit 101.

The resistance value acquiring unit 105 may acquire resistance values of all components indicated by the inter-component information stored in the inter-component information storage unit 101, or may acquire resistance values of part of the components. For example, if a transmission path is branched, the resistance value acquiring unit 105 may acquire a resistance value of component on one branch path. Furthermore, a resistance value may be acquired for a component other than a component directly connected to one component designated by the user or the like.

The component indicated by the inter-component information is specifically a component indicated by a component identifier contained in the inter-component information. The component may be a transmission destination component, may be a transmission source component, or may be both of these components. The resistance value of a component corresponding to the physical quantity is, for example, a value indicating the difficulty in transmitting the physical quantity with the component. For example, if the physical quantity that is transmitted between components is heat, the resistance value that is to be acquired by the resistance value acquiring unit 105 is a heat resistance value. Furthermore, if the physical quantity that is transmitted between components is current, the resistance value that is to be acquired by the resistance value acquiring unit 105 is an electrical resistance value. An example of the process in which the resistance value acquiring unit 105 acquires a resistance value of one or at least two components will be described later.

Furthermore, the resistance value acquiring unit 105 preferably acquires a resistance value of a component that is a physical quantity generating source such as a heat generating source, using a process different from that for a component that is not the generating source. An example of the process that acquires a resistance value of a component that is a physical quantity generating source in this case will be described later. Note that a component that is a heat generating source is, for example, a concept that encompasses a component that has a heat generating source.

Furthermore, the resistance value acquiring unit 105 may acquire a resistance value of one or more groups indicated by the group management information, using the inter-component information. For example, a value of the physical quantity that is transmitted (e.g., an actual transmission physical quantity), a state value, and the like may be acquired for a component belonging to a group from the inter-component information, and a resistance value may be acquired for the group using the acquired information. An example of the process that acquires a resistance value of a group will be described later.

Furthermore, the resistance value acquiring unit 105 preferably acquires a resistance value of a group having a component that has a physical quantity generating source such as a heat generating source, using a process different from that for a group not having the generating source. An example of the process that acquires a resistance value of a group in this case will be described later.

Note that the resistance value acquiring unit 105 may not acquire a resistance value of a group, for a component belonging to no group indicated by the group management information. Alternatively, each component belonging to no group indicated by the group management information may be considered as one group, and the resistance value acquiring unit 105 may acquire a resistance value of each component, as a resistance value of a group to which that component belongs.

There is no limitation on the timing, the trigger, and the like to cause the resistance value acquiring unit 105 to acquire a resistance value of each group. For example, if an instruction to acquire a resistance value of groups or an instruction to output a physical quantity transmission path of groups is accepted from the user or the like by an unshown accepting unit, the resistance value acquiring unit 105 may acquire a resistance value of each group, for one or more components forming that group, and, if no instruction is accepted, or if an instruction to acquire a resistance value of components or an instruction to output a physical quantity transmission path of components is accepted, the resistance value acquiring unit 105 may acquire a resistance value of each component, without acquiring a resistance value of each group. Alternatively, a resistance value of each group may be acquired by default.

Hereinafter, the process in which the resistance value acquiring unit 105 acquires a resistance value of a component corresponding to the physical quantity will be described by way of an example. Below, a case will be described as an example in which the resistance value is a heat resistance value on a heat transmission path.

Figure 2A:
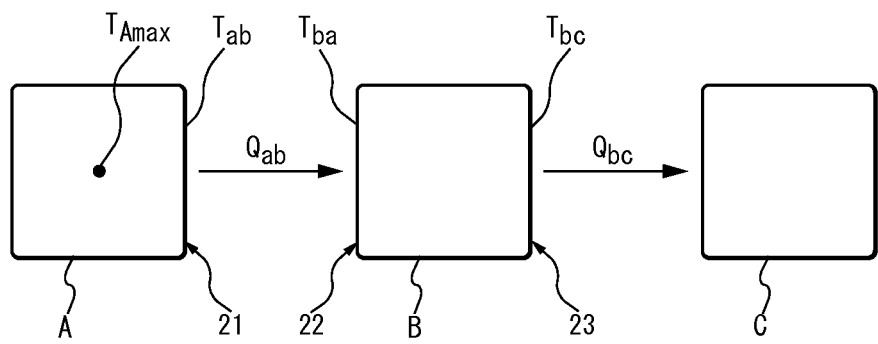
FIGS. 2A and 2B are a schematic diagram (FIG. 2A) illustrating a resistance value in a case where the number of transmission destinations of a physical quantity is one, and a schematic diagram (FIG. 2B) illustrating a resistance value in a case where the number of transmission destinations of a physical quantity is multiple, in the information processing apparatus in this Example.
Figure 2B:
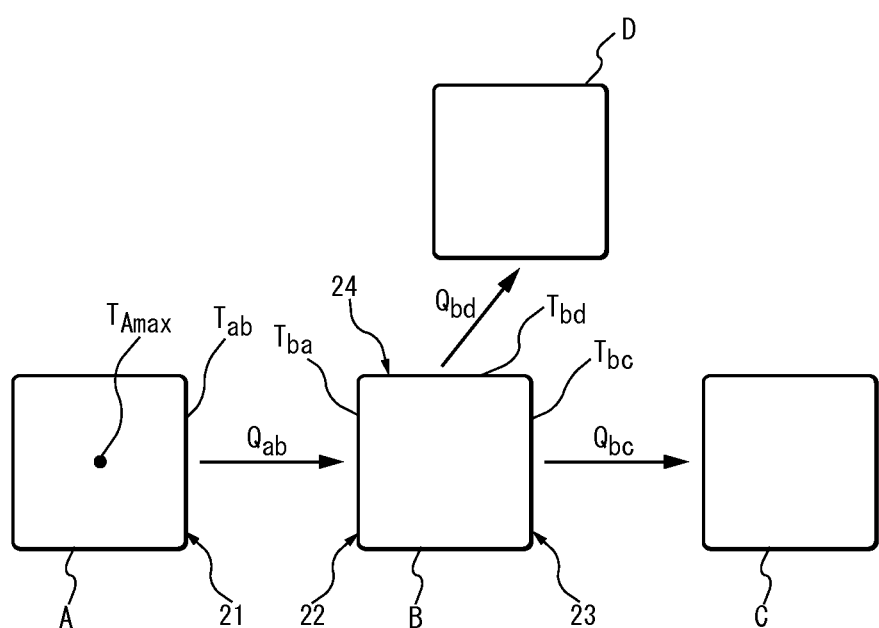

(A) The Case in which the Number of Transmission Destination Components is One and the Number of Transmission Source Components is One FIGS. 2A and 2B are a schematic diagram (FIG. 2A) illustrating heat resistance in a case where one acquisition object component is provided with one transmission destination component, and a schematic diagram (FIG. 2B) illustrating heat resistance in a case where one acquisition object component is provided with two transmission destination components.

In FIG. 2A, a component A and a component B are in contact with each other, the component B and a component C are in contact with each other, an amount $Q_{ab}$ of heat is an amount of heat transmitted from the component A to the component B, and an amount $Q_{bc}$ of heat is an amount of heat transmitted from the component B to the component C. The amounts $Q_{ab}$ and $Q_{bc}$ of heat are the actual transmission physical quantities described above. Furthermore, a surface temperature $T_{ab}$ is a surface temperature of the component A at a face 21 thereof in contact with the component B, a surface temperature $T_{ba}$ is a surface temperature of the component B at a face 22 thereof in contact with the component A, and a surface temperature $T_{bc}$ is a surface temperature of the component B at a face 23 thereof in contact with the component C. Furthermore, a maximum temperature $T_{Amax}$ is maximum temperature inside the component A.

Furthermore, FIG. 2B is a diagram showing a state in which the component B is further connected to the component D in the multiple components shown in FIG. 2A. An amount $Q_{bd}$ of heat is an amount of heat transmitted from the component B to the component D, and is an actual transmission physical quantity. Furthermore, a surface temperature $T_{bd}$ is a surface temperature of the component B at a face 24 thereof in contact with the component D.

In the case as shown in FIG. 2A, a heat resistance value $R_B$ of the component B is represented as follows.

$$R_B = \frac{T_{ba} - T_{bc}}{Q_{bc}}$$

That is to say, a heat resistance value R of an acquisition object component is obtained by subtracting a surface temperature $T_{out}$ of the acquisition object component on a contact face thereof in contact with a transmission destination component to which heat is transmitted from the acquisition object component, from a surface temperature $T_{in}$ of the acquisition object component on a contact face thereof in contact with a transmission source component from which heat is transmitted to the acquisition object component, and dividing the resulting value by an amount $Q_{out}$ of heat, which is an actual transmission physical quantity that is transmitted from the acquisition object component to the transmission destination component. That is to say, the heat resistance value is represented as follows.

$$R = \frac{T_{in} - T_{out}}{Q_{out}} \quad (1)$$

(B) The Case in which the Acquisition Object Component is a Physical Quantity Generating Source Furthermore, FIG. 2A shows a case in which the component A is a component that is a physical quantity generating source, specifically, a heat generating source in this example (or a case in which the component A is a component to which heat is directly applied without being interrupted by another component or the like in a simulation, etc.). In such a case, the heat resistance of the component A is represented as follows.

$$R_A = \frac{T_{Amax} - T_{ab}}{Q_{ab}}$$

That is to say, a heat resistance value $R_g$ of an acquisition object component that is a physical quantity generating source is obtained by subtracting a surface temperature $T_{out}$ of the acquisition object component on a contact face thereof in contact with a transmission destination component to which heat is transmitted from the acquisition object component, from a maximum temperature $T_{max}$ of the acquisition object component, and dividing the resulting value by an amount $Q_{out}$ of heat, which is an actual transmission physical quantity that is transmitted from the acquisition object component to the transmission destination component. That is to say, the heat resistance value is represented as follows.

$$R_g = \frac{T_{max} - T_{out}}{Q_{out}} \quad (2)$$

(C) The Case in which the Number of Transmission Source Components is One and the Number of Transmission Destination Components is Multiple In the description above, an explanation was given of equations for calculating a heat resistance value in a case where an acquisition object component is provided with one transmission source component and one transmission destination component. Hereinafter, a case will be described in which one acquisition object component is provided with one transmission source component and multiple transmission destination components, with reference to FIG. 2B.

In FIG. 2B, in order to acquire a heat resistance value of the component B, first, a heat resistance value is calculated for each heat transmission path from the component B. Such a resistance value of each path is referred to as a path resistance value. Furthermore, since this is a heat resistance value of each path in this example, such a heat resistance value of each path is referred to as a path heat resistance value.

If a path heat resistance value of the component B acquired for a heat transmission path from the component A via the component B to the component C is taken as $R_{BonAC}$, it is represented as follows as in Equation (1) above.

$$R_{BonAC} = \frac{T_{ba} - T_{bc}}{Q_{bc}}$$

Furthermore, if a path heat resistance value of the component B acquired for a heat transmission path from the component A via the component B to the component D is taken as $R_{BonAD}$, it is represented as follows.

$$R_{BonAD} = \frac{T_{ba} - T_{bd}}{Q_{bd}}$$

A heat resistance value $R_B$ of the component B is defined as a value obtained by compositing the path heat resistance values $R_{BonAC}$ and $R_{BonAD}$. In this case, the path heat resistance values are composited assuming that the path heat resistance values are connected in parallel. That is to say, the values are composited as follows.

$$\frac{1}{R_B} = \frac{1}{R_{BonAC}} + \frac{1}{R_{BonAD}}$$

That is to say, in a case where the number of transmission destination components is m (m is an integer of 2 or more) and the number of transmission source components is one, the heat resistance value R of the acquisition object component is obtained by compositing path resistance values acquired for paths from the acquisition object component respectively to the first to the m-th transmission destination components. A path resistance value $R_{outj}$ acquired for a j-th transmission destination component (j is an integer from 1 to m) is obtained by subtracting a surface temperature $T_{outj}$ of the acquisition object component on a contact face thereof in contact with the j-th component that is a transmission destination to which heat is transmitted from the acquisition object component, from a surface temperature $T_{in}$ of the acquisition object component on a contact face thereof in contact with the transmission source component from which heat is transmitted to the acquisition object component, and dividing the resulting value by an amount $Q_{outj}$ of heat, which is an actual transmission physical quantity that is transmitted from the acquisition object component to the transmission destination component. The heat resistance value R of the acquisition object component is obtained by compositing path resistance values $R_{out1}$ to $R_{outm}$.

That is to say, equations for calculating the heat resistance value R are represented as follows.

$$R_{outj} = \frac{T_{in} - T_{outj}}{Q_{outj}} \quad (3)$$

$$\frac{1}{R} = \frac{1}{R_{out\ 1}} + \frac{1}{R_{out\ 2}} + \ldots + \frac{1}{R_{out\ m}} \quad (4)$$

Figure 3A:
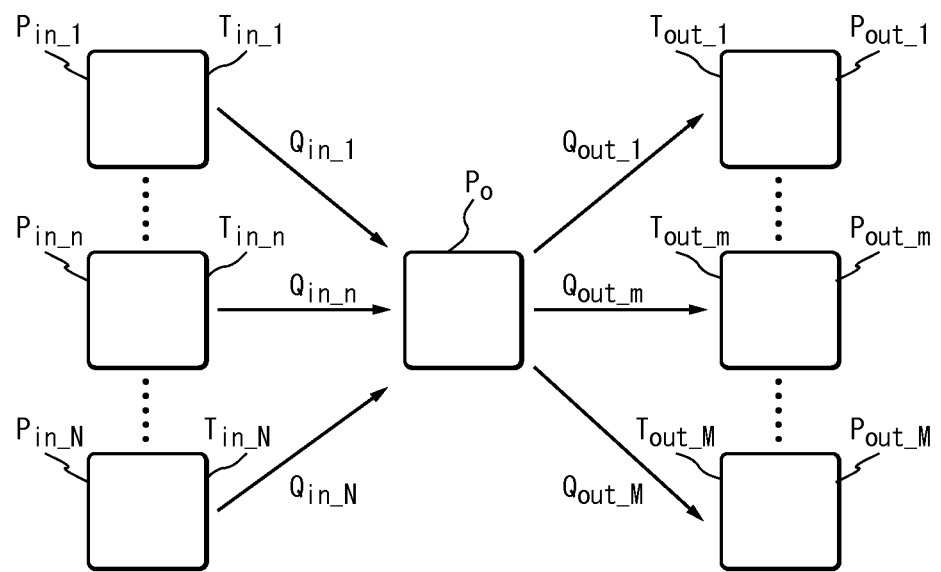
FIGS. 3A and 3B are a schematic diagram (FIG. 3A) illustrating a resistance value of a group, and a schematic diagram (FIG. 3B) illustrating a resistance value in a case where a group has a physical quantity generating source, in the information processing apparatus in this Example.
Figure 3B:
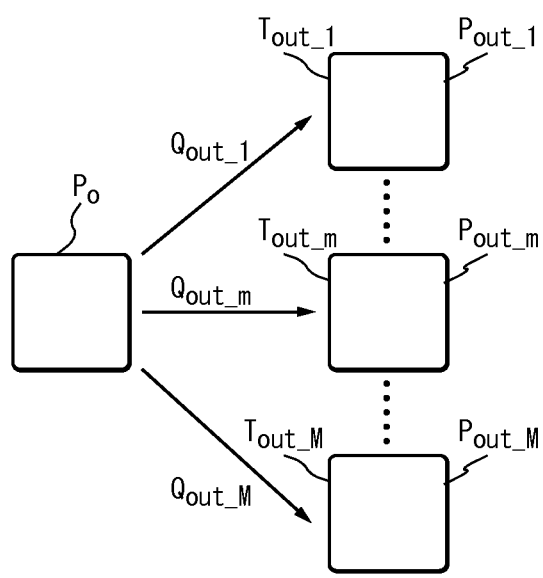

(D) The Case in which the Number of Transmission Source Components is N and the Number of Transmission Destination Components is M FIGS. 3A and 3B are a schematic diagram (FIG. 3A) illustrating heat resistance in a case where one acquisition object component is provided with N transmission source components (N is an integer of 1 or more) and M transmission destination components (M is an integer of 1 or more), and a schematic diagram (FIG. 3B) illustrating heat resistance in a case where one acquisition object component that is a heat generating source is provided with M transmission destination components (M is an integer of 1 or more).

Hereinafter, the process that acquires a heat resistance value in a case where one acquisition object component is provided with N transmission source components (N is an integer of 1 or more) from which heat is transmitted and M transmission destination components (M is an integer of 1 or more) will be described with reference to FIG. 3A.

In FIG. 3A, a component $P_{in\_n}$ (n is an integer from 1 to N) is a transmission source component from which heat is transmitted to an acquisition object component $P_0$, and a component $P_{out\_m}$ (m is an integer from 1 to M) is a transmission destination component to which heat is transmitted from the acquisition object component $P_0$. Further, $Q_{in\_n}$ is an amount of heat transmitted from the component $P_{in\_n}$ to the acquisition object component $P_0$, $T_{in\_n}$ is a surface temperature of the acquisition object component $P_0$ at a portion thereof in contact with the component $P_{in\_n}$, $Q_{out\_m}$ is an amount of heat transmitted from the acquisition object component $P_0$ to the component $P_{out\_m}$, and $T_{out\_m}$ is a surface temperature of the acquisition object component $P_0$ at a portion thereof in contact with the component $P_{out\_m}$. The amounts $Q_{in\_n}$ and $Q_{out\_m}$ of heat are the actual transmission physical quantities described above. The component $P_{in\_n}$ is connected to the acquisition object component $P_0$, and the component $P_{out\_m}$ is connected to the acquisition object component $P_0$.

In FIG. 3A, an amount $Q_{in\_total}$ of heat transmitted from the N transmission source components to the component $P_0$, and an amount $Q_{out\_total}$ of heat transmitted from the component $P_0$ to the M transmission destination components are represented respectively as follows.

$$Q_{in\_total} = \sum_{n=1}^{N} Q_{in\_n}$$

$$Q_{out\_total} = \sum_{m=1}^{M} Q_{out\_m}$$

For example, in the case of a steady-state analysis, $Q_{in\_total} = Q_{out\_total}$.

The number of heat paths at the acquisition object component $P_0$ is N×M because it is the number of combinations of a transmission source component and a transmission destination component.

In this case, a path resistance value $R_{nm}$, which is heat resistance on a heat transmission path from the component $P_{in\_n}$ via the acquisition object component $P_0$ to the component $P_{out\_m}$ is calculated as follows.

$$R_{nm} = \frac{T_{in\_n} - T_{out\_m}}{Q_{out\_m} \times \alpha} \quad (5)$$

In the equation, α is a value for assuming a contribution rate in the heat transfer from the component $P_{in\_n}$ with respect to the amount of heat toward the component $P_{out\_m}$, and is obtained, for example, as follows.

$$\alpha = \frac{Q_{in\_n}}{Q_{in\_total}}$$

Note that the contribution rate α is, for example, any value as along as it is a proper value enabling calculation of a path resistance value $R_{nm}$ that seems to be proper, and values other than the above may be used. For example, it is also possible that α=1, for example. Furthermore, the contribution rate may be not used in some cases.

A path resistance value $R_{nm}$ is calculated for each of N×M paths using Equation (5) above, and an average of these values, such as a harmonic average $R_{avg}$ of the acquired path resistance values $R_{nm}$, is calculated using the following equation or the like, so that a heat resistance value $R_0$ of the acquisition object component $P_0$ is acquired.

$$R_0 = R_{avg} = \frac{N \times M}{\sum_{n=1}^{N} \sum_{m=1}^{M} \frac{1}{R_{nm}}} \quad (6)$$

Note that the process that acquires a resistance value in a case where the number of transmission source components is N and the number of transmission destination components is M may be applied to a case in which at least one of N and M is two or more, preferably to a case in which both of N and M are two or more. For example, if N is 1, the above-described process in a case where the number of transmission source components is one and the number of transmission destination components is multiple may be performed.

Furthermore, the heat resistance $R_{nm}$ may not be performed using Equation (5) above for a path where $T_{in\_n} - T_{out\_m}$ is negative in Equation (5), in the heat transmission path from the component $P_{in\_n}$ via the acquisition object component $P_0$ to the component $P_{out\_m}$, and this $R_{nm}$ may not be included in the calculation of the average in Equation (6) above.

Note that the above-described process and the like are based on the assumption that, in a case where N transmission source components and M transmission destination components are connected to an acquisition object component, N×M heat paths are present at the acquisition object component. However, even in a case where N transmission source components and M transmission destination components are connected, the number of heat paths may be actually smaller than N×M depending on the state or the like of connected components. For example, the N×M heat paths may include a heat path that does not actually exist. Accordingly, the path resistance values acquired using the above-described equations may partially include negative values. If such path resistance values are used to calculate a heat resistance value of a component or a component group, the heat resistance may be negative. Accordingly, if a path resistance value that is negative is obtained, for example, this path resistance value may be excluded from the calculation of a harmonic average of the path resistance values. This processing makes it possible to calculate more precise heat resistance. Note that the same is applied to the description below.

(E) The Case in which the Acquisition Object Component is a Physical Quantity Generating Source, and the Number of Transmission Destination Components is M Next, a heat resistance value of an acquisition object component in a case where the acquisition object component that is a physical quantity generating source, specifically, a heat generating source in this example is connected to M transmission destination components (M is an integer of 1 or more) will be described with reference to FIG. 3B. The configuration in FIG. 3B is obtained by, in the configuration shown in FIG. 3A, setting the acquisition object component $P_0$ as a heat generating source, taking the component $P_{out\_m}$ as one or more transmission destination components, and deleting the transmission source component $P_{in\_n}$. In FIG. 3B, the component $P_0$ may be a component having an unshown heat generating source as described above.

The resistance value acquiring unit 105 calculates a path resistance value $R_{nm}$ for each of M transmission paths from the acquisition object component $P_0$ to the component $P_{out\_m}$, using Equation (5) above. In this example, a path resistance value $R_{nm}$ is acquired for each component $P_{out\_m}$, assuming that the transmission source component $P_{in\_n}$ is the acquisition object component $P_0$ that is a heat generating source, and a surface temperature $T_{in\_n}$ is $T_{0max}$, which is a maximum temperature of the component $P_0$.

The path resistance value $R_{nm}$ is calculated as follows.

$$R_{nm} = \frac{T_{0max} - T_{out\_m}}{Q_{out\_m}} \quad (7)$$

Then, an average of the path resistance values $R_{nm}$ calculated for the respective M paths, such as a harmonic average $R_{avg}$, is calculated using the following equation or the like, so that a heat resistance value $R_0$ of the acquisition object component $P_0$ that is a heat generating source is acquired.

$$R_0 = R_{avg} = \frac{M}{\sum_{m=1}^{M} \frac{1}{R_{nm}}} \quad (8)$$

The resistance value acquiring unit 105 judges, for example, whether or not a component is a heat generating source, and, if it is judged that the component is a heat generating source, the resistance value acquiring unit 105 acquires a heat resistance value of this component as described above. There is no limitation on how the resistance value acquiring unit 105 judges whether or not a component is a heat generating source. For example, it may be judged that a component is a heat generating source, if the inter-component information indicates that heat is transmitted from this component to one or more other components, and that the amount of heat transmitted from this component to the one or more other components is larger than the total amount of heat transmitted from the other components to this component.

Furthermore, it may be judged that a component is a heat generating source, if this component is indicated by a component identifier stored in a storage unit such as the inter-component information storage unit 101 in association with information indicating that the component is a heat generating source. Note that the component that is a heat generating source in this case may be a component that is a heat generating source leading a heat transmission path. In this case, it may be judged that a component is a heat generating source, if a value obtained by subtracting the total amount of heat transmitted from one or more other components to this component from the total amount of heat transmitted from this component to the one or more other components is larger than the total amount of heat transmitted from the one or more other components to this component. If the amount of heat received by a component from surrounding components connected thereto is larger than the amount of heat generated by this component, this component does not have the highest temperature in a group of surrounding components including this component, and, thus, with the above-described judgment, it is possible to judge that this component is not a heat generating source leading a heat transmission path even though it is a component that generates heat.

(F) The Case in which a Heat Resistance Value is Acquired for a Component Group

Next, a case will be described in which a heat resistance value is acquired for a component group. Below, a case will be described as an example in which a component group G, which is a group of components, is arranged instead of the acquisition object component $P_0$ in FIG. 3A.

First, as in the case of acquiring a heat resistance value of the acquisition object component $P_0$, a path resistance value of the component group G is acquired for each of N×M paths. The component group G is configured by one or more components, and an n-th transmission source component $P_{in\_n}$ is not necessarily connected to all components forming the component group G. Accordingly, the resistance value acquiring unit 105 detects, in the component group G, a component to which heat is transmitted from the component $P_{in\_n}$, and acquires the total amount of heat transmitted to the detected components, as the amount of heat transmitted from the component $P_{in\_n}$ to the component group G.

For example, if the component group G includes K components to which heat is transmitted from the component $P_{in\_n}$, and an amount of heat transmitted from the component $P_{in\_n}$ to a k-th component ($1 \leq k \leq K$) in the K components is taken as $Q_{nk}$, an amount $Q_{in\_n}$ of heat transmitted from the component n to the component group G is calculated as follows.

$$Q_{in\_n} = \sum_{k=1}^{K} Q_{nk} \quad (9)$$

In the equation, the amount $Q_{nk}$ of heat is an actual amount of heat transmitted in this example.

Furthermore, the resistance value acquiring unit 105 calculates a surface temperature $T_{in\_n}$ of the component group G at a portion thereof connected to the component $P_{in\_n}$, through a weighted average of a surface temperature $T_{nk}$ of a k-th component ($1 \leq k \leq K$) at a portion thereof connected to the component $P_{in\_n}$, in the K components in the component group G, to which heat is transmitted from the component n, using the amount $Q_{nk}$ of heat as weight. That is to say, the surface temperature is obtained as follows.

$$T_{in\_n} = \frac{\sum_{k=1}^{K} Q_{nk} T_{nk}}{\sum_{k=1}^{K} Q_{nk}} \quad (10)$$

Furthermore, in a similar manner, if an m-th transmission destination component $P_{out\_m}$ is a transmission destination of heat from K components forming the component group G, an amount of heat transmitted from a k-th component ($1 \leq k \leq K$) in the K components to the component $P_{out\_m}$ is taken as $Q_{mk}$, and a surface temperature of the k-th component of the component group G at a portion thereof connected to a component $P_{out\_m}$ is taken as $T_{mk}$, an amount $Q_{out\_m}$ of heat transmitted from the component group G to the component $P_{out\_m}$, and a surface temperature $T_{out\_m}$ of the component group G at a portion thereof connected to the component Pont, are calculated using the following equations. In the equation, the amount $Q_{mk}$ of heat is an actual amount of heat transmitted in this example.

$$Q_{out\_m} = \sum_{k=1}^{K} Q_{mk} \quad (11)$$

$$T_{out\_m} = \frac{\sum_{k=1}^{K} Q_{mk} T_{mk}}{\sum_{k=1}^{K} Q_{mk}} \quad (12)$$

Then, using the calculated values, a path resistance value $R_{nm}$ of the component group G is calculated for each of heat transmission paths from the component n via the component group G to the component m, using Equation (5) above. Then, an average of the calculated path resistance values for the N×M paths, such as a harmonic average $R_{avg}$, is calculated using the following equation or the like, so that the heat resistance value $R_g$ of the component group G is acquired. That is to say, the average is acquired as follows.

$$R_{avg} = \frac{N \times M}{\sum_{n=1}^{N} \sum_{m=1}^{M} \frac{1}{R_{nm}}} \quad (13)$$

(G) The Case in which a Component Group Includes a Component that is a Physical Quantity Generating Source Hereinafter, the case in which the components forming the component group G include a component that is a physical quantity generating source, specifically, a heat generating source in this example will be described. Below, a case will be described as an example in which a component group G, which is a group of components, is arranged instead of the acquisition object component $P_0$ in FIG. 3B.

The resistance value acquiring unit 105 calculates a path resistance value $R_{nm}$ for each of M transmission paths from the component group G to the component $P_{out\_m}$, using an equation similar to Equation (7) above. In this example, a maximum temperature of a component that is a heat generating source contained in the component group G is used as the maximum temperature $T_{0max}$ of the component. Furthermore, an amount $Q_{out\_m}$ of heat transmitted from the component group G to the m-th component $P_{out\_m}$ is calculated using Equation (11) above, and a surface temperature $T_{out\_m}$ of the component group G at a portion thereof connected to the m-th component $P_{out\_m}$ is calculated using Equation (12) above.

Then, using the calculated path resistance value $R_{nm}$ for each of M paths, $R_{avg}$ calculated using Equation (8) is acquired as the heat resistance value $R_g$ of the component group G having a component that is a heat generating source.

The resistance value acquiring unit 105 judges, for example, whether or not a component group includes a component that is a heat generating source, and, if it is judged that the component group includes a heat generating source, the resistance value acquiring unit 105 acquires a heat resistance value of this component group as described above.

The resistance value acquiring unit 105 acquires a heat resistance value of one or at least two components, for example, by substituting as appropriate a heat amount or a surface temperature of a component acquired from the inter-component information for Equations (1) to (13) above, according to the connection situation, that is, the physical quantity transmission path between components.

In the description above, an explanation was given of the case of acquiring a heat resistance value, but it is also possible to acquire an electrical resistance value. In this case, in the equations above, it is possible to use a current value instead of an amount of heat transmitted, a potential of a component instead of a surface temperature of a component, and a maximum current output from a component instead of a maximum internal temperature of a component. The maximum internal temperature or the maximum current of a component may be considered as a value indicating a state inside the component. Furthermore, it is also possible to acquire a resistance value on other physical quantities using the above-described equations while changing values that are to be input thereto.

Furthermore, the resistance value acquiring unit 105 may acquire a resistance value on a physical quantity of one or at least two components using calculation equations, approximation equations, or the like other than the equations above.

For example, the resistance value acquiring unit 105 may composite resistance values acquired by the resistance value acquiring unit 105 for two or more components belonging to a group, thereby acquiring a resistance value of the group. In the case of compositing resistance values, for example, resistance values of two or more components are considered as resistance values of resistors connected in parallel, and are composited using a calculation equation for resistors connected in parallel. Alternatively, as in the case of acquiring combined resistance of ordinary electrical resistors, a resistance value composited according to the connection situation between components may be acquired. For example, if components are connected in series without being branched, combined resistance may be calculated using an equation for calculating a combined resistance of resistors connected in series, and, if components are branched and connected in parallel, combined resistance may be calculated using an equation for calculating a combined resistance of resistors connected in parallel. Furthermore, if the number of components belonging to a group is one, a resistance value of the component may be acquired as it is as a resistance value of the group.

If components are connected in a complicated manner, the resistance value acquiring unit 105 may acquire a resistance value, for example, by using the above-described calculation equations in combination as appropriate. Furthermore, the process that calculates path resistance values of an acquisition object component and the process that calculates a resistance value of an acquisition object component by compositing the calculated path resistance values may use calculation equations or processing similar to those in the process that calculates resistance values of electrical resistors in a circuit in which multiple electrical resistances are combined or the process that calculates combined resistance by compositing the calculated resistance values. In the case of calculating heat resistance using the process that calculates electrical resistance, it is possible to use an amount of heat instead of current transmitted, a surface temperature of a component instead of a potential of a component, and a maximum internal temperature of a component instead of a maximum current output from a component.

Hereinafter, an example of the process in which the resistance value acquiring unit 105 acquires a resistance value such as a heat resistance value of an acquisition object component using the inter-component information will be described. Note that, in the case of acquiring a resistance value of multiple acquisition object components, the above-described process may be performed for each component.

The resistance value acquiring unit 105 detects a transmission destination component of an acquisition object component from which a resistance value is to be acquired, using the inter-component information. The detecting a component may be considered as acquiring a component identifier of the component. Note that the same is applied to the description below.

For example, if the inter-component information has a component identifier of a transmission source component, a component identifier specifying a transmission destination component of the component, and an actual transmission physical quantity that is transmitted from the transmission source component to the transmission destination component, the resistance value acquiring unit 105 acquires, as the component identifier of a transmission destination component of the acquisition object component, a component identifier of a transmission destination component contained in one or more pieces of inter-component information having a component identifier of a transmission source matching the component identifier of the acquisition object component. Furthermore, this actual transmission physical quantity in the inter-component information is also acquired.

Alternatively, if the inter-component information has information indicating a component identifier of a first component, a component identifier of a second component connected to the first component, and an actual transmission physical quantity that is transmitted from the first component to the second component, a transmission destination component may be detected according to the sign of the actual transmission physical quantity. For example, if the sign of the actual transmission physical quantity in a case where the actual transmission physical quantity from the second component to the first component is taken as positive, the resistance value acquiring unit 105 searches for one or more pieces of inter-component information having a component identifier of a first component matching the component identifier of the acquisition object component. In this inter-component information, an actual transmission physical quantity that is negative indicates that the second component is the transmission destination component of the acquisition object component, and, thus, the resistance value acquiring unit 105 in this case acquires the component identifier of the second component, that is, the component identifier of the transmission destination component, and the actual transmission physical quantity, from the inter-component information in which a value of an actual transmission physical quantity is negative, from among the detected inter-component information. Note that if the inter-component information has a value of the physical quantity that is bidirectionally transmitted between the first component and the second component, as in the case where the inter-component information has a value of the physical quantity that is transmitted from the first component to the second component and a value of the physical quantity that is transmitted from the second component to the first component, a difference between these physical quantities may be acquired as the actual transmission physical quantity.

Furthermore, for example, if the inter-component information has a component identifier of a transmission source component, a component identifier of a transmission destination component, and a state value of the transmission source component at a portion thereof connected to a component indicated by the component identifier of the transmission destination, the resistance value acquiring unit 105 acquires, as the state value of an acquisition object component at a portion thereof in contact with a transmission destination component, a state value of the connected portion contained in the inter-component information having a component identifier of a transmission source component matching the component identifier of the acquisition object component, and a component identifier of a transmission destination component matching the component identifier of the transmission destination component associated with the acquisition object component. In this example, a state value of the acquisition object component at a portion thereof connected to the transmission destination component is referred to as a transmission destination-side state value.

Furthermore, the resistance value acquiring unit 105 detects a transmission source component of the acquisition object component, for example, using the inter-component information. For example, if the inter-component information has a component identifier of a transmission source component, and a component identifier of a transmission destination component to which the transmission is to be performed from the component indicated by the component identifier, the resistance value acquiring unit 105 acquires, as the component identifier of a transmission source of the acquisition object component, a component identifier of a transmission source component contained in the inter-component information having a component identifier of a transmission destination component matching the component identifier of the acquisition object component.

Alternatively, if the inter-component information has information indicating a component identifier of a first component, a component identifier of a second component connected to the first component, and an actual transmission physical quantity that is transmitted from the first component to the second component, as described above, a transmission source component may be detected according to the sign of the actual transmission physical quantity.

Furthermore, for example, if the inter-component information has a component identifier of a transmission source component, a component identifier of a transmission destination component, and a state value of the transmission destination component at a portion thereof connected to the transmission source component, the resistance value acquiring unit 105 acquires, as the state value of an acquisition object component at a portion thereof in contact with a transmission source component, a state value of the connected portion contained in the inter-component information having a component identifier of a transmission destination component matching the component identifier of the acquisition object component, and a component identifier of a transmission source component matching the component identifier of the transmission source component associated with the acquisition object component. In this example, a state value of the acquisition object component at a portion thereof connected to the transmission source component is referred to as a transmission source-side state value.

Then, the resistance value acquiring unit 105 uses one or more transmission source components and one or more transmission destination components detected for each acquisition object component, one or more actual transmission physical quantities acquired for the one or more transmission destination components, one or more transmission source-side state values, and one or more transmission destination-side state values, to acquire a resistance value of the acquisition object component using Equations (1) to (13) and the like shown above according to the connection situation between the acquisition object component, the transmission source components, and the transmission destination components. The using Equations (1) to (13) and the like shown above is a concept that encompasses executing calculation processing or programs corresponding to these equations and the like.

For example, if one transmission source component and one transmission destination component are detected by the resistance value acquiring unit 105, the resistance value acquiring unit 105 acquires a resistance value of an acquisition object component by substituting the transmission source-side state value, the transmission amount, the transmission destination-side state value, and the actual transmission physical quantity for Equation (1) above.

Furthermore, for example, if N transmission source components (N is an integer of 1 or more) and M transmission destination components (M is an integer of 1 or more) are detected by the resistance value acquiring unit 105, the resistance value acquiring unit 105 acquires a path resistance value by substituting the transmission source-side state value, and the actual transmission physical quantity and the transmission destination-side state value acquired for each detected transmission destination component of Equation (5) above, and acquires a resistance value of the acquisition object component by compositing the acquired path resistance values using Equation (6). Note that, if N and M are "1", the resistance value may be calculated, using Equation (1) as described above, or using Equations (5) and (6) and the like without using Equation (1) above. Furthermore, if N is "1" and M is "2" or more, the resistance value may be calculated, using Equations (3) and (4) above, or using Equations (5) and (6) and the like without using Equations (3) and (4) above.

If the acquisition object component is a component that has a physical quantity generating source such as a heat generating source, a maximum state value of the acquisition object component (e.g., maximum internal temperature of the component, or current generated by the component), the transmission destination-side state value, and the actual transmission physical quantity are used to acquire a resistance value using Equations (2), (7), and (8) and the like. There is no limitation on how to judge whether or not the acquisition object component is a component that generates a physical quantity. For example, if the inter-component information or the component temperature management information has information specifying a component that has a physical quantity generating source such as a component identifier, flag information indicating whether or not a component is a generating source associated with a component identifier, and the like, the resistance value acquiring unit 105 may judge whether or not the acquisition object component is a component that generates a physical quantity according to the information specifying a component that has a physical quantity generating source. Alternatively, a component provided with no transmission source component of a physical quantity such as an actual transmission physical quantity, for example, a component that transmits a physical quantity to another component, but does not receive any physical quantity from another component may be judged as a component that has a physical quantity generating source.

The resistance value acquiring unit 105 may be realized typically by an MPU, a memory, or the like. Typically, the processing procedure of the resistance value acquiring unit 105 is realized by software, and the software is stored in a storage medium such as a ROM. Note that the processing procedure may be realized also by hardware (a dedicated circuit).

The display information generating unit 106 generates display information using the inter-component information. The display information is information for displaying a transmission path diagram. The transmission path diagram is an image showing a physical quantity transmission path having nodes respectively associated with two or more components contained in one or at least two pieces of inter-component information. The transmission path diagram displayed using the display information generated by the display information generating unit 106 is an image in which information indicating resistance values acquired by the resistance value acquiring unit 105 is arranged at nodes associated with one or more components from which resistance values have been acquired by the resistance value acquiring unit 105. The display information generating unit 106 generates display information for displaying a transmission path diagram, for example, based on a connection relationship between components, a transmission situation of a physical quantity, or a transmission direction of a physical quantity between components indicated by the inter-component information.

The transmission path is a path on which a physical quantity corresponding to the inter-component information is transmitted. The transmission path is a path on which a physical quantity is transmitted via components indicated by the inter-component information. Accordingly, the transmission path has nodes associated with components. The node may be considered as an element or a connection point on the transmission path, and may be considered as a start point, an end point, an intermediate point, a branch point, or the like on the transmission path. The node may be considered as representing the position or the like of a component on the transmission path. For example, the transmission path is a path linking nodes associated with components between which the physical quantity is transmitted.

The transmission path diagram is, for example, an image in which nodes on the transmission path are arranged, and is an image in which nodes associated with two components between which the physical quantity is transmitted are connected to each other. The nodes being connected to each other refers to a state in which the nodes are connected to each other in a visually recognizable manner, specifically, the nodes may be actually connected to each other by an image of a line such as a straight line or a curved line or the like, or, alternatively, an image of a line such as a straight line or a curved line or the like, or a character string may be arranged between nodes such that the connected nodes can be identified from other nodes.

For example, the display information generating unit 106 generates display information for a transmission path diagram in which each node on the transmission path is arranged, and in which two nodes respectively associated with two components between which the physical quantity is transmitted are connected to each other. The arranging a node is, for example, arranging an image, a character string, or the like indicating the node. The image indicating a node is, for example, an image having a predesignated shape such as a circle or a rectangle. The image indicating a node may be considered as an image object or the like. The display information generating unit 106 preferably connects nodes by arranging, between the nodes, a line connected to each of the nodes. Alternatively, it is also possible to arrange, between the nodes, an image or a character string indicating that the nodes are connected to each other. A line connecting nodes, or an image or a character string arranged between nodes may have an arrow or the like indicating an actual transmission direction of the physical quantity. Furthermore, a line connecting nodes, or an image or a character string arranged between nodes may be a band-like image or the like indicating the direction by means of gradation, a change in the color, or the like. For example, the transmission path diagram may be a directed coordinate system indicating a transmission direction of the physical quantity. The information indicating a node may have information specifying a component associated with the node, such as information of a character string indicating a component identifier or the like. The transmission path diagram may be considered, for example, as an image in which an image, a character string, or the like associated with each component indicated by the inter-component information is arranged, and in which images respectively associated with two components between which the physical quantity is transmitted are linked by a line such as a straight line.

The transmission path diagram preferably indicates transmission paths having nodes respectively associated with three or more components. The reason for this is that, as transmission paths are more complicated, understanding the relationship of the physical quantity transmission between components becomes more difficult, and, thus, the effect of displaying a transmission path diagram, for making the transmission paths understandable, is increased.

The information indicating a resistance value is, for example, a character string or an image indicating the resistance value. The information indicating a resistance value is arranged such that the correspondence with a node associated with a component from which this resistance value has been acquired is visually recognizable. The information being arranged such that the correspondence with a node is visually recognizable is, for example, a concept that encompasses arrangements in which the information is positioned close to the node or is linked to the node by a leader line or the like. Note that the position near a node is a concept that encompasses the position on the node, for example.

The positions on which nodes are arranged in the transmission path diagram may be any positions as long as the connection relationship between the nodes matches the connection relationship between the nodes on the transmission path.

The display information is typically image information such as raster images or vector images. Note that there is no limitation on the data type or file format of the display information as long as the information can display a transmission path diagram. The display information may be information other than the image information, for example, such as information that can display a transmission path diagram by performing rendering with particular application software such as a web browser or a dedicated viewer. The transmission path diagram that is finally displayed on a monitor or the like using the display information is typically an image such as a bitmap image showing transmission paths.

Next, an example of the process in which the display information generating unit 106 generates display information will be described. The display information generating unit 106 reads one piece of inter-component information from the inter-component information storage unit 101, arranges nodes associated with two component identifiers contained in the inter-component information, specifically, images showing the nodes or the like in a virtual two-dimensional space or a virtual three-dimensional space such as an xy plane, and connects the nodes by arranging images such as lines between the arranged nodes. The arranged nodes correspond to nodes on transmission paths. Furthermore, a node associated with each component is associated with a component identifier, and information indicating the resistance value acquired for that component by the resistance value acquiring unit 105, such as a character string indicating the resistance value, is arranged at the position corresponding to the arranged node, for example, near the node.

In a similar manner, the display information generating unit 106 sequentially reads other inter-component information, and repeats the same process. If a node associated with one of the two component identifiers indicated by the newly read inter-component information has been already arranged, the display information generating unit 106 does not newly arrange the node associated with this component identifier, arranges a node that has not been arranged and is associated with the other component identifier, and connects this node and the already arranged node associated with the component identifier by arranging an image such as a line between the nodes. Furthermore, if nodes respectively associated with both of the two component identifiers indicated by the newly read inter-component information have been already arranged, the display information generating unit 106 omits the process that arranges the nodes of these component identifiers, and the like. The display information generating unit 106 performs a similar process on all pieces of inter-component information used for generating a transmission path diagram, thereby generating display information for displaying a transmission path diagram.

Note that the display information generating unit 106 may, instead of arranging images of nodes corresponding to component identifying information or lines or the like arranged between the nodes in a virtual two-dimensional space or a virtual three-dimensional space, acquire information used by the output unit 107 or the like for arranging nodes or lines, such as the coordinates at which nodes are arranged, the coordinates of start points or end points of lines arranged between the nodes, and the like, and generate display information having the information.

Further, the display information generating unit 106 may arrange nodes associated with multiple components, for example, all components contained in multiple pieces of inter-component information at random or according to a rule specified first, and then connect these nodes according to a correspondence between the component identifiers indicated by the inter-component information.

The process in which the display information generating unit 106 generates display information may be processes other than the above. Furthermore, as the process that generates display information for displaying a transmission path diagram, known processes may be used that are similar to the process that generates images showing a link relationship between multiple webpages using information indicating the link relationship between the multiple webpages, or information for displaying the images. The process that generates images or the like showing a link relationship is a known art, and, thus, a detailed description thereof has been omitted.

Furthermore, the display information generating unit 106 may generate display information for displaying a transmission path diagram in which a transmission path is shown where nodes respectively indicating one or more groups indicated by the group management information are arranged instead of nodes of one or at least two components belonging to the one or more groups. Furthermore, the display information generating unit 106 may generate, for example, display information for displaying a transmission path diagram in which nodes indicating groups and nodes of components belonging to no group are both arranged.

For example, if a component identifier contained in each piece of inter-component information matches a component identifier contained in one or more pieces of group management information, the display information generating unit 106 replaces the matching component identifier with a group identifier indicated by the group management information having this component identifier. Then, nodes associated with two identifiers contained in each piece of inter-component information after the replacement process are arranged, and these nodes are connected as in the case of generating display information for a transmission path diagram without group display, so that display information is generated. Each of the two identifiers refers to either a component identifier or a group identifier with which the component identifier has been replaced. Accordingly, the display information generating unit 106 can generate display information for displaying transmission paths on which a node of a component belonging to a group has been replaced by a node of the group.

If there are pieces of inter-component information after the replacement process having the same identifier of a transmission source component or group and the same identifier of a transmission destination component or group, the display information generating unit 106 preferably synthesizes them into one piece of information by adding values of physical quantities that are transmitted, calculating an average of the state values, or the like, and arranges the nodes using the synthesized information. The synthesizing may be considered as combining. Then, the display information generating unit 106 may use the synthesized value of the physical quantity, state value, or the like, as the value of the physical quantity that is transmitted by the transmission source component or group or the state value of the transmission source component or group. Accordingly, for example, nodes of two groups can be prevented from being connected to each other by two lines. Furthermore, for example, the display information generating unit 106 may arrange the synthesized information and the like on the nodes associated with the groups arranged in a transmission path diagram.

Furthermore, for example, in display information for displaying a transmission path diagram already generated by arranging components indicated by the inter-component information, the display information generating unit 106 replaces a node of a component belonging to a group indicated by a piece of group management information with a node indicating the group, and, instead of connecting the node of the component belonging to that already present group and nodes of components not belonging to that group or nodes of the other groups, connects the node of that group and nodes of components not belonging to that group or nodes of the other groups. Then, this process may be sequentially performed also on other pieces of group management information, so that display information for displaying transmission paths on which replacement to nodes of groups has been performed.

Furthermore, in the case of generating display information for a transmission path diagram in which a transmission path is shown where nodes of groups are arranged as described above, the display information generating unit 106 generates display information for a transmission path diagram in which information indicating a resistance value acquired for each group by the resistance value acquiring unit 105 is arranged at each of nodes respectively associated with one or more groups on the transmission paths shown in the transmission path diagram. The information indicating a resistance value is a character string or an image showing the resistance value. The arranging the resistance value on a node of a group is the same as arranging the resistance value on a node of a component.

A node of a group may be displayed in a manner different from that for a node of a component. Furthermore, a node of a group may be displayed in association with a group identifier or the like. A group identifier may be, for example, contained in the group management information.

Note that one component indicated by the component identifier contained in the inter-component information may be one group configured by one or at least two components indicated by one piece of group management information. Furthermore, a resistance value of this group may be considered as a resistance value acquired using one or at least two components belonging to the group, for example, as a resistance value obtained by compositing resistance values of two or more components.

The display information generating unit 106 may switch the process that generates display information indicating a transmission path diagram using the group management information and the process that generates display information indicating a transmission path diagram without using the group management information, for example, according to a switching instruction accepted from the user by an unshown accepting unit or the like. The resistance value acquiring unit 105 may acquire a resistance value of a component or a resistance value of a component group when a switching instruction is accepted, or may in advance acquire a resistance value of a component or a resistance value of a component group and accumulate the value in an unshown storage unit or the like. The display information generated using the group management information may be display information for a transmission path diagram in which nodes of groups corresponding to the group management information and nodes of components belonging to no group are both arranged.

The display information generating unit 106 may generate display information for displaying a transmission path diagram showing part of transmission paths from among the physical quantity transmission paths having nodes respectively associated with two or more components. For example, the display information generating unit 106 may selectively generate display information for displaying a transmission path diagram having only paths configured by components between which an actual transmission physical quantity larger than a threshold value is transmitted. The threshold value may be a predesignated value, or may be a value that changes according to an actual transmission physical quantity or the like, such as an average or a median of multiple actual transmission physical quantities. Furthermore, the display information generating unit 106 may selectively generate display information for displaying a transmission path diagram having only paths configured by components between which an actual transmission physical quantity is transmitted, the order in magnitude of the actual transmission physical quantity being up to a given order. Furthermore, the display information generating unit 106 may selectively generate display information for displaying a transmission path diagram having only paths extending through one or more components designated by the user using an unshown accepting unit or the like. Note that the same is applied to a case in which components are displayed as groups. In this case, one group configured by components may be taken as one component as appropriate.

Furthermore, the display information generating unit 106 may generate, for example, display information for a transmission path diagram in which nodes associated with components are arranged in a coordinate system having two axes representing a component temperature and a component heat resistance value. For example, the display information generating unit 106 acquires component temperature information corresponding to each of two or more components associated with two or more nodes on the transmission path, from the component temperature management information storage unit 102. Then, the display information generating unit 106 generates display information for a transmission path diagram in which a node associated with each component is arranged, in a coordinate system having two axes representing a component temperature and a component heat resistance value, at a position specified with a temperature of that component indicated by the component temperature information acquired for that component and a heat resistance value acquired for that component by the resistance value acquiring unit 105. The nodes may be connected to each other by performing the above-described process. The position specified with an acquired component temperature and an acquired component heat resistance value is the position specified by the coordinates indicated by an acquired component temperature and an acquired component heat resistance value in the above-described coordinate system. Note that the same is applied to a case in which components are displayed as groups. In this case, one group configured by components may be taken as one component as appropriate.

Furthermore, the display information generating unit 106 may generate, for example, display information for a transmission path diagram in which nodes associated with components are arranged in a coordinate system having two axes representing a component temperature and a component surface area or volume. For example, the display information generating unit 106 acquires component temperature information corresponding to each of two or more components associated with nodes on the transmission path, from the component temperature management information storage unit 102. Furthermore, the display information generating unit 106 acquires component size information corresponding to each of two or more components forming nodes on the transmission path, from the component size information storage unit 103. Then, the display information generating unit 106 generates display information for a transmission path diagram in which information indicating a node associated with each component is arranged, in a coordinate system having two axes representing a component temperature and a component surface area or volume, at a position specified with a temperature of that component indicated by the component temperature information acquired for that component and a surface area or volume of that component indicated by the component size information acquired for that component. The nodes may be connected to each other by performing the above-described process. The position specified with an acquired component temperature and an acquired component surface area or volume is the position specified by the coordinates indicated by an acquired component temperature and an acquired component surface area or volume in the above-described coordinate system. Note that the same is applied to a case in which components are displayed as groups. In this case, one group configured by components may be taken as one component as appropriate.

If the component size information has the surface area information and the volume information, the display information generating unit 106 may acquire component size information having only information matching the coordinate system that is to be displayed, from among the two types of information. For example, if the axis regarding the component size in the coordinate system that is to be displayed is a volume, component size information having only volume information may be acquired, and, if the axis regarding the component size in the coordinate system that is to be displayed is a surface area, component size information having only surface area information may be acquired.

Furthermore, the display information generating unit 106 may detect a component having a high heat resistance value using heat resistance values of components associated with nodes on the transmission path acquired by the resistance value acquiring unit 105, and generate display information for a transmission path diagram in which a node associated with the detected component can be identified from other nodes. Note that the same is applied to a case in which components are displayed as groups. In this case, one group configured by components may be taken as one component as appropriate.

The detecting a component having a high heat resistance value is, for example, detecting a component having a heat resistance value with a magnitude that satisfies a predesignated condition, or, alternatively, is detecting a component having a heat resistance value that is high enough to satisfy a predesignated condition. The predesignated condition is, for example, is a condition that the heat resistance value is higher than a threshold value. Alternatively, the predesignated condition is a condition that the heat resistance value is a threshold value or more. The threshold value may be a predesignated value, or may be an average, a median, or the like acquired using heat resistance values of multiple components forming transmission paths. Furthermore, the predesignated condition may be, for example, a condition that the order in magnitude of the heat resistance value, in multiple components forming transmission paths, is higher than a given order.

The state in which a node can be identified refers to a state in which the node is displayed in a manner different from that for other nodes. For example, information different from that for other nodes is used as the information indicating the node. For example, the display information generating unit 106 may generate display information for a transmission path diagram in which information indicating a node associated with the detected component is displayed in a color, a shape, a pattern, or a size different from that for other nodes. The state in which a node can be identified may be considered as a state in which the node is displayed in a manner emphasized with respect to other nodes, for example, in a color, a shape, or the like emphasized with respect to other nodes. For example, it may be a state in which a balloon having a predesignated character string or the like is arranged at the position corresponding to the node.

Furthermore, the display information generating unit 106 may detect two or more components between which a large physical quantity is transmitted, and generate display information for a transmission path diagram in which a line connecting nodes associated with the two or more detected components has an appearance identifiable from lines connecting other components. The physical quantity that is transmitted between components is, for example, the above-described actual transmission physical quantity. The two or more components between which a large physical quantity is transmitted are, for example, components forming a pair of a transmission source component and a transmission destination component between which a large physical quantity is transmitted. Note that the same is applied to a case in which components are displayed as groups. In this case, one group configured by components may be taken as one component as appropriate.

The detecting two or more components between which a large physical quantity is transmitted is, for example, detecting two or more components, for example, one or more pairs of one or more components, between which the physical quantity with a magnitude that satisfies a predesignated condition is transmitted. Alternatively, it may be detecting two or more components between which the physical quantity that is large enough to satisfy a predesignated condition is transmitted. The predesignated condition is, for example, a condition that the physical quantity is larger than a threshold value. The threshold value may be a predesignated value, or may be an average, a median, or the like acquired using physical quantities that are transmitted between multiple components forming transmission paths. Furthermore, the predesignated condition may be, for example, a condition that the order in magnitude of the physical quantity, in multiple components forming transmission paths, is higher than a given order. The display information generating unit 106 may detect, for example, multiple pairs having the same component.

A line having an identifiable appearance refers to, for example, a line displayed in a manner different from that for other lines. The line displayed in a different manner is, for example, a line displayed in a color, a thickness, a pattern, or a shape different from that for other lines. The line having an identifiable appearance may be considered as a line displayed in a manner emphasized with respect to other lines.

Furthermore, the display information generating unit 106 may detect a component having a low resistance value and not connected to any of the two or more components between which a large physical quantity is transmitted, and generate display information for a transmission path diagram in which a node associated with the detected component can be identified from other nodes. Note that the same is applied to a case in which components are displayed as groups. In this case, one group configured by components may be taken as one component as appropriate.

For example, as described above, the display information generating unit 106 detects two or more components between which a large physical quantity is transmitted. Then, a component having a heat resistance value that is low enough to satisfy a predesignated condition, and not connected to either of the components forming the pairs of the detected components is detected. Then, as described above, display information is generated for a transmission path diagram in which the detected node can be identified from other nodes. The predesignated condition in the case of detecting a component having a heat resistance value that is low enough to satisfy the predesignated condition is, for example, a condition that the heat resistance value is lower than a threshold value. The threshold value may be a predesignated value, or may be an average, a median, or the like acquired using heat resistance values acquired for components not connected to the detected components among the multiple components forming transmission paths. Furthermore, the predesignated condition may be, for example, a condition that the order in magnitude of the heat resistance value, in components not connected to the detected components among the multiple components forming transmission paths, is lower than a given order.

There is no limitation on how to judge whether or not two components are connected to each other. For example, if any of the inter-component information has component identifiers of two components, it may be judged that the two components are connected to each other, and, if not, it may be judged that they are not connected to each other.

There is no limitation on the timing, the trigger, and the like to cause the display information generating unit 106 to generate these various sorts of display information. For example, display information may be generated, if an instruction to generate or output this sort of display information is accepted from the user or the like by an unshown accepting unit or the like. Furthermore, this sort of display information may be generated by default or the like. Furthermore, the processes that generate these various sorts of display information may be switched according to an instruction from the user or the like.

The display information generating unit 106 may be realized typically by an MPU, a memory, or the like. Typically, the processing procedure of the display information generating unit 106 is realized by software, and the software is stored in a storage medium such as a ROM. Note that the processing procedure may be realized also by hardware (a dedicated circuit).

The output unit 107 outputs the display information generated by the display information generating unit 106. For example, the output unit 107 may switch the processes that output different multiple pieces of display information generated by the display information generating unit 106 as appropriate according to an instruction from the user or the like.

The output in this case is, for example, displaying of a transmission path diagram using the display information on a display screen, projection using a projector, or printing with a printer. Furthermore, the output in this case is a concept that encompasses transmission of the display information to an external apparatus, accumulation in a storage medium, delivery of a processing result to another processing apparatus or another program, and the like.

The output unit 107 may be considered to include or not to include an output device such as a display screen. The output unit 107 may be realized, for example, by driver software for an output device, a combination of driver software for an output device and the output device, or the like.

Figure 4:
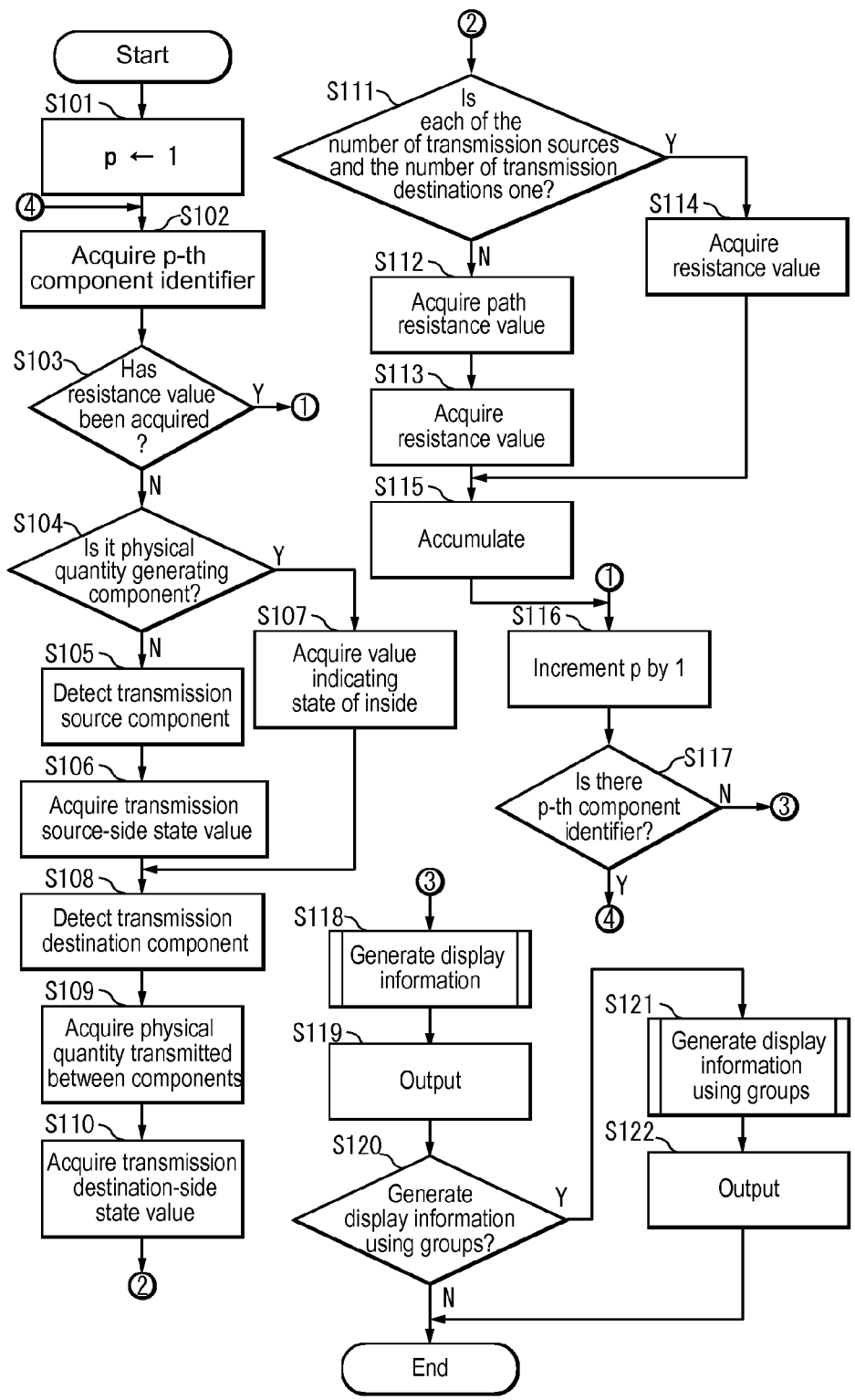
FIG. 4 is a flowchart illustrating an operation of the information processing apparatus in this Example.

Next, an exemplary operation of the information processing apparatus 1 will be described with reference to the flowchart in FIG. 4.

(Step S101) The resistance value acquiring unit 105 substitutes 1 for a counter p.

(Step S102) The resistance value acquiring unit 105 acquires a p-th component identifier from the inter-component information stored in the inter-component information storage unit 101. The p-th component identifier may be a p-th component identifier without overlaps obtained by performing uniquifying processing or the like on multiple component identifiers contained in two or more pieces of inter-component information, or may be a p-th component identifier without taking overlaps into consideration. If the p-th component identifier is acquired without overlaps, the subsequent step S103 may be omitted.

(Step S103) The resistance value acquiring unit 105 judges whether or not a resistance value associated with the p-th component identifier has been acquired. For example, it is judged whether or not a resistance value associated with the p-th component identifier is stored in an unshown storage unit. If the resistance value is stored, it is judged that the p-th component identifier has been acquired, and, if not, it is judged that the p-th component identifier has not been acquired. If the p-th component identifier has been acquired, the procedure advances to step S116, and, if not, the procedure advances to step S104.

(Step S104) The resistance value acquiring unit 105 judges whether or not the p-th component identifier corresponds to a component that generates a physical quantity, using the component temperature information or the like. For example, if the inter-component information or the like contains the p-th component identifier in association with information indicating that the component generates a physical quantity, it is judged that the component generates a physical quantity, and, if not, it is judged that the component does not generate a physical quantity. If the component generates a physical quantity, the procedure advances to step S107, and, if not, the procedure advances to step S105.

(Step S105) The resistance value acquiring unit 105 detects a transmission source component of the p-th component, using the inter-component information. For example, the resistance value acquiring unit 105 acquires component identifiers of all components from which an actual transmission physical quantity is transmitted to the p-th component.

(Step S106) The resistance value acquiring unit 105 acquires a transmission source-side state value of the p-th component, for each transmission source component detected in step S105, using the inter-component information. The transmission source-side state value acquired for each transmission source component is temporarily stored in an unshown storage unit or the like in association with the component identifier of each component detected in step S105.

(Step S107) The resistance value acquiring unit 105 acquires a value indicating a state inside the p-th component, using the inter-component information or the like.

(Step S108) The resistance value acquiring unit 105 detects a transmission destination component of the p-th component, using the inter-component information. For example, the resistance value acquiring unit 105 acquires component identifiers of all components to which an actual transmission physical quantity is transmitted from the p-th component.

(Step S109) The resistance value acquiring unit 105 acquires an actual transmission physical quantity that is transmitted from the p-th component, for each transmission destination component detected in step S108.

(Step S110) The resistance value acquiring unit 105 acquires a transmission destination-side state value of the p-th component, for each transmission destination component detected in step S108. The transmission destination-side state value acquired for each transmission destination component and the actual transmission physical quantity acquired in step S109 are temporarily stored in an unshown storage unit or the like in association with the component identifier of each component detected in step S108.

(Step S111) The resistance value acquiring unit 105 judges whether or not each of the number of transmission source components and the number of transmission destination components is one. If each of the numbers is one, the procedure advances to step S114, and, if not, the procedure advances to step S112.

(Step S112) The resistance value acquiring unit 105 acquires a path resistance value of each of two or more paths formed by combining one transmission source component and one transmission destination component, using the transmission source-side state value, the transmission destination-side state value, and the actual transmission physical quantity that is transmitted from the p-th component.

(Step S113) The resistance value acquiring unit 105 acquires a resistance value of the p-th component, using the multiple path resistance values acquired in step S112. For example, the resistance value acquiring unit 105 acquires a resistance value of the p-th component by compositing the multiple path resistance values. Then, the procedure advances to step S115.

(Step S114) The resistance value acquiring unit 105 acquires a resistance value of the p-th component, using the transmission source information acquired for the one transmission source component, the transmission destination information acquired for the one transmission destination component, and the actual transmission physical quantity. Then, the procedure advances to step S115.

(Step S115) The resistance value acquiring unit 105 accumulates the resistance value acquired for the p-th component in an unshown storage unit in association with the component identifier of the p-th component.

(Step S116) The resistance value acquiring unit 105 increments the counter p by 1.

(Step S117) The resistance value acquiring unit 105 judges whether or not the p-th component identifier is contained in the inter-component information stored in the inter-component information storage unit 101. If contained, the procedure returns to step S102, and, if not, the procedure advances to step S118.

(Step S118) The display information generating unit 106 generates display information. The generating display information is generating display information without using the group management information.

(Step S119) The display information generating unit 106 outputs the display information generated in step S118. Then, the process is ended.

(Step S120) The display information generating unit 106 judges whether or not to generate display information using component groups. For example, if an instruction to generate display information using groups is accepted from the user or the like, it is determined to generate display information using groups. The generating display information using component groups is generating display information using the group management information, and, for example, is generating display information using nodes of groups instead of nodes of components belonging to groups indicated by the group management information. If it is determined to generate display information using groups, the procedure advances to step S121, and, if not, the process is ended.

(Step S121) The display information generating unit 106 generates display information using the group management information. This process will be described later in detail.

(Step S122) The display information generating unit 106 outputs the display information generated in step S121. Then, the process is ended.

Figure 5:
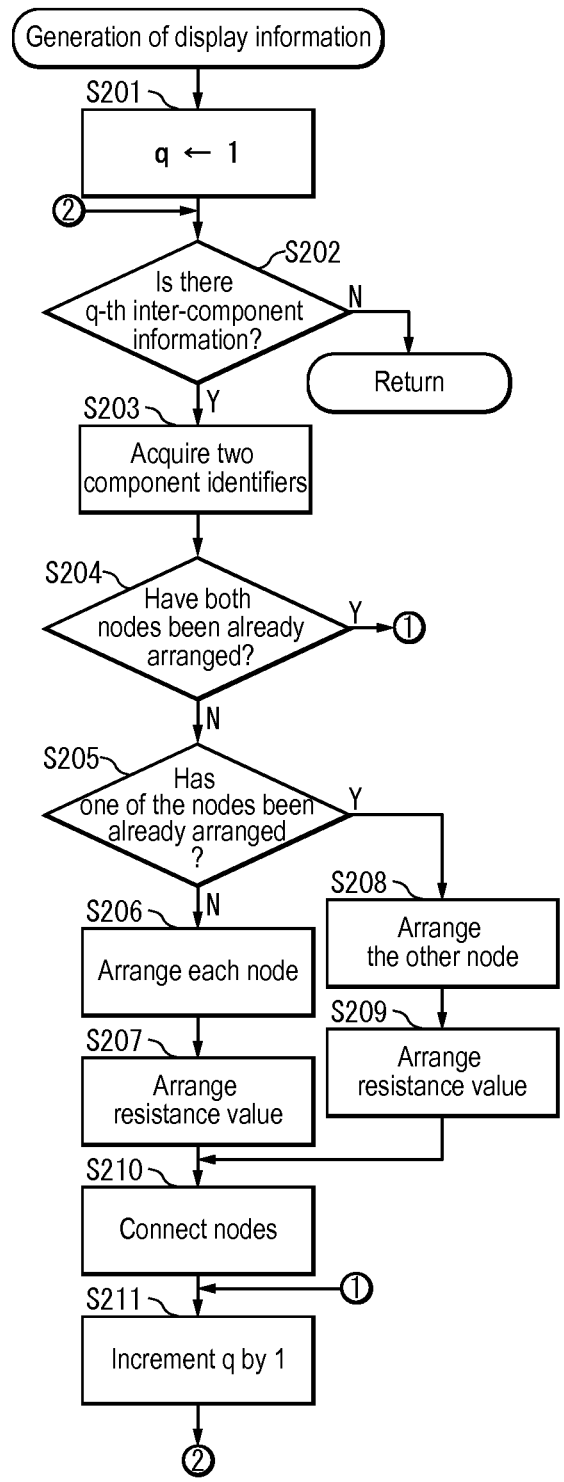
FIG. 5 is a flowchart illustrating an operation of the information processing apparatus in this Example.

Next, an example of the process in which the information processing apparatus 1 generates display information without using groups will be described with reference to the flowchart in FIG. 5. This process is a process corresponding to step S118 in FIG. 4.

(Step S201) The display information generating unit 106 substitutes 1 for a counter q.

(Step S202) The display information generating unit 106 judges whether or not there is a q-th piece of inter-component information in the inter-component information storage unit 101. If there is, the procedure advances to step S203, and, if not, the procedure returns to the upper-level processing.

(Step S203) The display information generating unit 106 acquires two component identifiers contained in the q-th piece of inter-component information.

(Step S204) The display information generating unit 106 judges whether or not nodes respectively associated with the two component identifiers acquired in step S203 have been already arranged in a virtual two-dimensional space, a virtual three-dimensional space, or the like for generating a transmission path diagram. If the nodes have been arranged, the procedure advances to step S211, and, if not, the procedure advances to step S205.

(Step S205) The display information generating unit 106 judges whether or not a node associated with either one of the two component identifiers acquired in step S203 has been already arranged. If the node has been arranged, the procedure advances to step S208, and, if not, the procedure advances to step S206.

(Step S206) The display information generating unit 106 arranges nodes respectively associated with the two component identifiers acquired in step S203, in a predesignated virtual two-dimensional space, virtual three-dimensional space, or the like. For example, predesignated images of nodes are arranged. The arranging in this case may be considered as acquiring coordinate values or the like of the positions at which the nodes are to be arranged. The arranged nodes are associated, for example, with component identifiers associated with the nodes. For example, the coordinates of the nodes are associated with component identifiers and stored in an unshown storage unit or the like. There is no limitation on the positions or the like at which the nodes are arranged. For example, the nodes may be arranged according to a rule specified first for arranging the nodes. Note that the same is applied to arrangement of other nodes.

(Step S207) The display information generating unit 106 arranges, on each node arranged in step S206, information indicating a resistance value acquired by the resistance value acquiring unit 105 for the component indicated by the component identifier associated with that node.

(Step S208) The display information generating unit 106 arranges the other node that has not been arranged.

(Step S209) The display information generating unit 106 arranges, on each arranged node, information indicating a resistance value acquired by the resistance value acquiring unit 105 for the component indicated by the component identifier associated with that node.

(Step S210) The display information generating unit 106 connects the nodes of the components indicated by the two component identifiers contained in the q-th piece of inter-component information. For example, the nodes of the components are connected to each other by a line segment or the like having an arrow oriented in the actual transmission direction of the physical quantity between the components associated with the nodes.

(Step S211) The display information generating unit 106 increments the counter q by 1. Then, the procedure returns to step S202.

Figure 6:
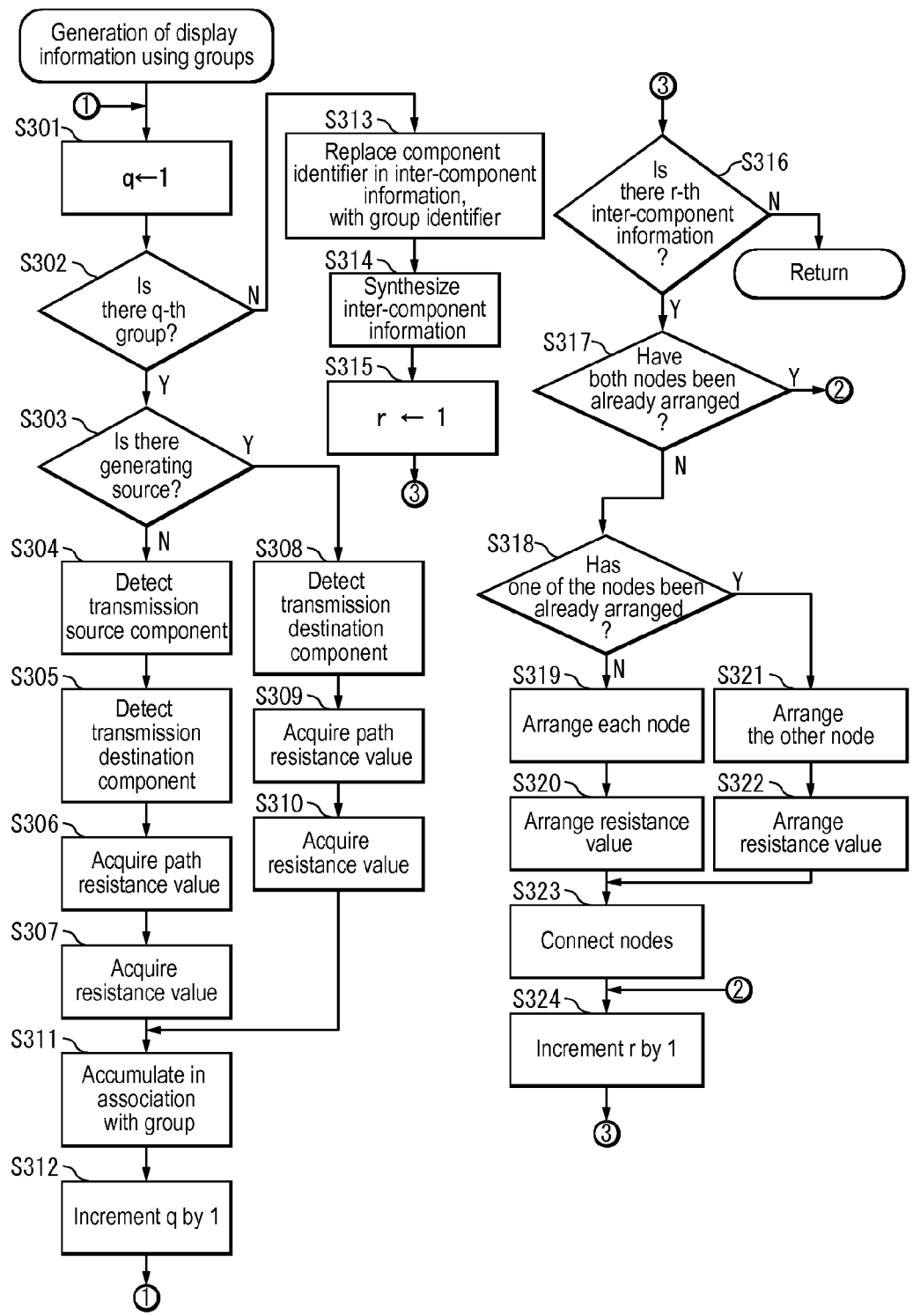
FIG. 6 is a flowchart illustrating an operation of the information processing apparatus in this Example.

Next, an example of the process in which the information processing apparatus 1 generates display information using groups will be described with reference to the flowchart in FIG. 6. This process is a process corresponding to step S121 in FIG. 4.

(Step S301) The resistance value acquiring unit 105 substitutes 1 for a counter q.

(Step S302) The resistance value acquiring unit 105 judges whether or not there is a q-th group configured by components. Note that, in this example, for the sake of convenience of the process, a component belonging to no group is taken as a group configured by one component. That is to say, the groups in this example are considered as including groups managed by the group management information or the like and components not managed by the group management information or the like. Note that the same is applied to each step in the process that generates display information using groups, which will be described below. Accordingly, the resistance value acquiring unit 105 judges whether or not there is the group management information for managing the q-th group, in groups including groups managed by the group management information or the like and groups configured by each component not managed by the group management information or the like. If there is the q-th group, the procedure advances to step S303, and, if not, the procedure advances to step S313.

(Step S303) The resistance value acquiring unit 105 judges whether or not there is a component that has a physical quantity generating source, in components forming the q-th group. If there is, the procedure advances to step S308, and, if not, the procedure advances to step S304.

(Step S304) The resistance value acquiring unit 105 detects a transmission source component of the q-th group. For example, the resistance value acquiring unit 105 sequentially detects component identifiers of components functioning as transmission source components of each component forming the q-th group and not belonging to the same group as the q-th group, using the inter-component information, and acquires component identifiers of one or at least two transmission source components by deleting overlapping identifiers except for one through uniquifying processing or the like performed on the one or at least two detected component identifiers. The resistance value acquiring unit 105 acquires, as the component identifier of the transmission source component, a component identifier of a component from which a physical quantity is transmitted to a component in the q-th group, for example, using the inter-component information.

(Step S305) The resistance value acquiring unit 105 detects a transmission destination component of the q-th group. For example, the resistance value acquiring unit 105 sequentially detects component identifiers of components functioning as transmission destination components of each component forming the q-th group and not belonging to the same group as the q-th group, using the inter-component information, and acquires a component identifier of a transmission destination component by deleting overlapping identifiers except for one through uniquifying processing or the like performed on the detected component identifiers. The resistance value acquiring unit 105 acquires, as the component identifier of the transmission destination component, a component identifier of a component to which a physical quantity is transmitted from a component in the q-th group, for example, using the inter-component information.

(Step S306) The resistance value acquiring unit 105 acquires a path resistance value for each combination of a transmission source component detected in step S304 and a transmission destination component detected in step S305. For example, an amount of heat transmitted from each transmission source component to the q-th group, and a surface temperature of the q-th group at a portion thereof connected to each transmission source component are acquired using Equations (9) and (10) and the like. Further, an amount of heat transmitted from the q-th group to each transmission destination component, and a surface temperature of the q-th group at a portion thereof connected to each transmission destination component are acquired using Equations (11) and (12) and the like. The thus obtained values are substituted for Equation (5), so that each path resistance value is acquired.

(Step S307) The resistance value acquiring unit 105 acquires a resistance value of the q-th group, using each path resistance value acquired in step S306. For example, each acquired path resistance value is substituted for Equation (13), so that a resistance value of the q-th group is acquired. Then, the procedure advances to step S311.

(Step S308) The resistance value acquiring unit 105 detects a transmission destination component of the q-th group, as in step S305.

(Step S309) The resistance value acquiring unit 105 acquires a path resistance value for each transmission destination component detected in step S305. For example, an amount of heat transmitted from the q-th group to each transmission destination component, and a surface temperature of the q-th group at a portion thereof connected to each transmission destination component are acquired using Equations (11) and (12) and the like. The thus obtained values are substituted for Equation (7), so that each path resistance value is acquired.

(Step S310) The resistance value acquiring unit 105 acquires a resistance value of the q-th group, using each path resistance value acquired in step S309. For example, each acquired path resistance value is substituted for Equation (8), so that a resistance value of the q-th group is acquired. Then, the procedure advances to step S311.

(Step S311) The resistance value acquiring unit 105 accumulates the resistance value acquired in step S307 or S310 in an unshown storage unit or the like in association with the q-th group. For example, the resistance value is accumulated in association with a group identifier of the q-th group. Furthermore, if the q-th group is not a group managed by the group management information but is one component, for example, the resistance value is accumulated in association with a component identifier of this component.

(Step S312) The resistance value acquiring unit 105 increments the counter q by 1. The procedure returns to step S302.

(Step S313) The resistance value acquiring unit 105 replaces each component identifier in the inter-component information, with a group identifier associated with that component identifier. Specifically, the resistance value acquiring unit 105 replaces each component identifier in the inter-component information, with a group identifier of a group indicated by the group management information having that component identifier. Note that a component identifier associated with no group identifier is not replaced.

(Step S314) The resistance value acquiring unit 105 synthesizes the inter-component information. Specifically, the display information generating unit 106 detects pieces of inter-component information having the same first group identifier and the same second group identifier in the multiple pieces of inter-component information after step S313, and synthesizes the one or more pieces of detected inter-component information having the same first group identifier and the same second group identifier into one piece of information. In this case, a component identifier not replaced in step S313 is also considered as a group identifier. Note that inter-component information in which the first group identifier is the same as the second group identifier is discarded because it is inter-component information for components in the same group. In the synthesis, for example, the transmission physical quantities contained in one or more pieces of detected inter-component information are added, and an average of the state values is calculated. If information such as a physical quantity that is transmitted between nodes of groups or between a node of a group and a node of a component, or a transmission direction thereof is not used for generating display information (e.g., if a transmission direction of the physical quantity between nodes or the like is not displayed in a transmission path diagram), for example, this step may be omitted.

(Step S315) The display information generating unit 106 substitutes 1 for a counter r.

(Step S316) The display information generating unit 106 judges whether or not there is an r-th piece of inter-component information in the inter-component information synthesized in step S314. If there is, the procedure advances to step S317, and, if not, the procedure returns to the upper-level processing. If the procedure returns to the upper-level processing, the display information acquired in the preceding processing may be stored or written in a specific file format.

(Step S317) The display information generating unit 106 judges whether or not nodes respectively associated with component identifiers corresponding to the two group identifiers contained in the r-th piece of inter-component information of the inter-component information synthesized in step S314 have been already arranged. If the two nodes associated with the identifiers have been already arranged, the procedure advances to step S324, and, if not, the procedure advances to step S318.

(Step S318) The display information generating unit 106 judges whether or not a node associated with either one of the two group identifiers contained in the r-th piece of inter-component information has been arranged. If the node associated with either one of the identifiers has been arranged, the procedure advances to step S321, and, if not, the procedure advances to step S319.

(Step S319) The display information generating unit 106 arranges nodes respectively associated with the two group identifiers contained in the r-th piece of inter-component information.

(Step S320) The display information generating unit 106 arranges, on each arranged node, a resistance value associated with the group identifier associated with that node. Then, the procedure advances to step S323.

(Step S321) The display information generating unit 106 arranges a node that has not been arranged and is associated with the other group identifier.

(Step S322) The display information generating unit 106 arranges, on each node arranged in step S318, a resistance value associated with the group identifier associated with that node. Then, the procedure advances to step S323.

(Step S323) The display information generating unit 106 connects the nodes, as in step S210. In this step, for example, a line connecting nodes may have an arrow or the like indicating the transmission direction, using information such as the physical quantity that is transmitted between groups or between a group and a component, indicated by the inter-component information synthesized in step S314.

(Step S324) The display information generating unit 106 increments the counter r by 1. Then, the procedure returns to step S316.

Hereinafter, a specific operation of the information processing apparatus 1 in this Example will be described by way of examples.

Specific Example 1

Figure 7:
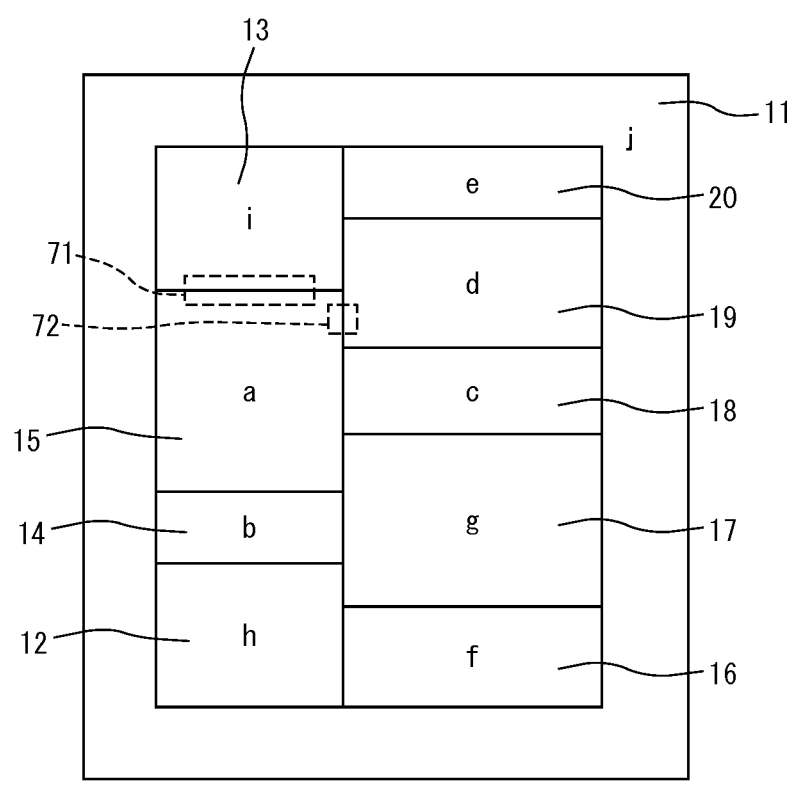
FIG. 7 is a schematic plan view showing the arrangement between components, illustrating an operation of the information processing apparatus in this Example.

FIG. 7 is a schematic plan view showing the arrangement between components subjected to a heat transmission simulation. In this example, ten components 11 to 20 are arranged such that each component is in contact with one or more other components. It is assumed that, in the drawings, "a" to "j" denote component names. The component 11 with the component name "j" is a fluid arranged around the components 12 to 20. In this example, the fluid is also regarded as a component. Furthermore, in the drawing, each of a region 71 and a region 72 is a portion having contact heat resistance between components.

Furthermore, it is assumed that the components 14 and 15 form a group, the components 18, 19, and 20 form a group, and the components 16 and 17 form a group.

FIG. 8 is an inter-component information management table for managing one or more pieces of inter-component information stored in the inter-component information storage unit 101. Each record (row) in the inter-component information management table indicates one piece of inter-component information. The inter-component information is inter-component information regarding the multiple components shown in FIG. 7, and, for example, is information having information obtained by the heat transmission simulation between the multiple components.

The inter-component information has attributes "component ID", "component name", "contact component ID", "surface temperature", and "amount of heat transmitted". The "component ID" is a component identifier, and, for example, is a number allocated to each component. In this example, it is assumed that "011" to "020" of "component ID" are respectively the component identifiers of the components 11 to 20. The "component name" is a component name, and, in this example, is one of the component names "a" to "j". The "contact component ID" is a component identifier of a component that is in contact with the component indicated by "component ID", and, in this example, the same component identifier for "component ID" is used.

The "surface temperature" is a surface temperature of the component indicated by "component ID" at a portion thereof in contact with the component indicated by "contact component ID". The unit for the temperature is, for example, "° C.". However, there is no limitation on the unit and the like. The "amount of heat transmitted" is an amount of heat transmitted from the component indicated by "component ID" substantially to the component indicated by "contact component ID", and, here, as an example, is a value obtained by subtracting the amount of heat transmitted from the component indicated by "component ID" to the component indicated by "contact component ID", from the amount of heat transmitted from the component indicated by "contact component ID" to the component indicated by "component ID" (i.e., the amount of heat received by the component indicated by "component ID). The unit for the amount of heat is "W (watt)". Note that there is no limitation on the unit and the like. The value being negative indicates that the amount of heat is as a result transmitted from the component indicated by "component ID" to the component indicated by "contact component ID", and the value being positive indicates that the amount of heat is as a result transmitted from the component indicated by "contact component ID" to the component indicated by "component ID". If the value is negative, the absolute value of "amount of heat transmitted" is the above-described actual transmission physical quantity in the case where the component indicated by "contact component ID" is taken as a transmission destination component. Since the physical quantity is heat in this example, this is also referred to as an actual amount of heat transmitted.

Note that, for example, if the "component ID" has an attribute value of "001", this attribute value may be referred to as a component ID "001". The same is applied to a combination of another attribute and an attribute value.

For example, as shown in FIG. 7, the region 71 between the component 13 and the component 15 has contact heat resistance, and, thus, a surface temperature of the component 13 at a portion thereof in contact with the component 15 is different from a surface temperature of the component 15 at a portion thereof in contact with the component 13. That is to say, in the inter-component information management table, the value of "surface temperature" in a record with "component ID" being "015" and "contact component ID" being "013" is different from the value of "surface temperature" in a record with "component ID" being "013" and "contact component ID" being "015". Note that the same is applied to the region 72 between the component 15 and the component 19. On the other hand, components without contact heat resistance therebetween have the same surface temperature on their contact faces.

It is assumed that the attribute values of "surface temperature", "amount of heat transmitted", and the like are, for example, values acquired by the heat transmission simulation or the like. This sort of heat transmission simulation is a known art, and, thus, a detailed description thereof has been omitted. Furthermore, it is assumed that the attribute values of "contact area" and the like are, for example, attribute values acquired from design data for components, for example, data acquired using CAD data, mesh data generated using the CAD data, or the like.

If records have the same "component ID" in the inter-component information shown in FIG. 8, that is, in the inter-component information management table, the components are in contact with the same component.

FIG. 9 is a group management table for managing one or more pieces of group management information stored in the group management information storage unit 104. The group management table has attributes "group ID" and "component ID". The "group ID" is a group identifier. The "component ID" is a component identifier of a component belonging to the group indicated by "group ID", and corresponds to "component ID" in the inter-component information management table. For example, the group management information is information generated by the user or the like.

FIG. 10 is a diagram showing a component temperature management table for managing the component temperature information stored in the component temperature management information storage unit 102. The component temperature management table has attributes "component ID", "component temperature", "heat source", and "maximum temperature". The "component temperature" is a temperature of the component indicated by "component ID", and, in this example, is an average temperature of the component. The "component ID" corresponds to "component ID" in the inter-component information management table. The "heat source" is information indicating whether or not the component indicated by "component ID" is a heat generating source, where "1" indicates that the component is a heat source, and "0" indicates that the component is not a heat source. The "maximum temperature" is a maximum temperature of a component. Note that, a temperature at a center portion of a component may be used as the maximum temperature of the component. The "component temperature" and "maximum temperature" are, for example, values acquired by a heat transmission simulation or the like.

First, the user gives an instruction to generate a transmission path diagram using the inter-component information shown in FIG. 8, via an unshown input device or the like, to the information processing apparatus 1.

The resistance value acquiring unit 105 starts the process that acquires heat resistance of each component. It is assumed that an instruction is given in advance to generate display information for displaying a transmission path diagram without a node associated with the component 11, which is a fluid, and the resistance value acquiring unit 105 does not acquire heat resistance of the component 11.

The resistance value acquiring unit 105 acquires a component identifier, which is a value of "component ID" of a piece of inter-component information stored in the inter-component information storage unit 101. In this example, "component ID" other than the component identifier "011" associated with the component 11 is searched for in the records in the inter-component information management table shown in FIG. 8 sequentially from the uppermost record to below, and "012", which is a value of "component ID" other than "011" that appears first in the tenth record from the top, is acquired.

The resistance value acquiring unit 105 judges whether or not a resistance value associated with the component identifier "012" has been acquired. In this case, the resistance value has not been acquired yet, and, thus, it is judged that the resistance value has not been acquired.

Next, the resistance value acquiring unit 105 judges whether or not the p-th component identifier corresponds to a component that generates a physical quantity, using the component temperature management information shown in FIG. 8 and the like. Specifically, it is judged whether or not, in the component temperature management table shown in FIG. 10, the value of "heat source" in the record with "component ID" being "012" is "1", which is a value indicating that the component is a heat source. In this case, the value is not "1", and, thus, it is judged that the component is not a heat source.

Since the component is not a heat source, the resistance value acquiring unit 105 detects a transmission source component from which an actual amount of heat transmitted is transmitted to the component with "component ID" being "012", and a transmission source-side surface temperature of this component, using the inter-component information management table shown in FIG. 8. That is, the resistance value acquiring unit 105 detects a record with "component ID" being "012" and "amount of heat transmitted" being positive, in the inter-component information management table shown in FIG. 8, and acquires a pair of "contact component ID" and "surface temperature" of the detected record. The acquired "contact component ID" is the component identifier of the transmission source component, and the acquired "surface temperature" is the transmission source-side surface temperature. Then, the acquired pair of "contact component ID" and "surface temperature" is stored in an unshown storage unit.

The pair of the contact component ID "014" and the surface temperature "0.218499" is acquired, the contact component ID "014" is stored as the component identifier of the transmission source component and the surface temperature "0.218499" is stored as the transmission source-side surface temperature that is the transmission source-side state value, in association with the component ID "012".

Furthermore, the resistance value acquiring unit 105 detects a transmission destination component to which an actual amount of heat transmitted is transmitted from the component with "component ID" being "012", and a transmission destination-side surface temperature of this component, and an actual amount of heat transmitted, using the inter-component information management table shown in FIG. 8. The actual amount of heat transmitted is an amount of heat as a result transmitted from the component with "component ID" being "012" to a component that is in contact with that component. In this case, the resistance value acquiring unit 105 detects a record with "component ID" being "012" and "amount of heat transmitted" being negative, in the inter-component information management table shown in FIG. 8, and acquires a group of "contact component ID", "surface temperature", and the absolute value of "amount of heat transmitted" of the detected record. The acquired "contact component ID" is the component identifier of the transmission destination component, the acquired "surface temperature" is the transmission destination-side surface temperature, and the acquired absolute value of "amount of heat transmitted" is "actual amount of heat transmitted". Then, the acquired group of "contact component ID", "surface temperature", and the absolute value of "amount of heat transmitted" is stored in an unshown storage unit.

FIG. 11 is a transmission destination management table for managing groups of a component identifier of a transmission destination component, a transmission destination-side surface temperature, and an actual amount of heat transmitted, acquired and stored by the resistance value acquiring unit 105. The transmission destination management table has attributes "component ID", "transmission destination ID", "transmission destination-side surface temperature", and "actual amount of heat transmitted". The "component ID" corresponds to "component ID" in FIG. 8 and the like. The "transmission destination ID" is a component identifier of a transmission destination component, and is "contact component ID" acquired as described above. The "transmission destination-side surface temperature" is a transmission destination-side surface temperature, and is "surface temperature" acquired as described above. The "actual amount of heat transmitted" is an actual amount of heat transmitted, and, in this example, is an absolute value of the amount of heat transmitted acquired as described above.

Next, since both the number of component identifiers of transmission source components and the number of component identifiers of transmission destination components acquired above are not one, the resistance value acquiring unit 105 acquires a path resistance value for each combination of a component identifier of a transmission source component and a component identifier of a transmission destination component. In this example, path resistance values of a first combination of the component identifier "014" of the transmission source component and the transmission destination ID "011", a second combination of the component identifier "014" of the transmission source component and the transmission destination ID "016", and a third combination of the component identifier "014" of the transmission source component and the transmission destination ID "017" are acquired using Equation (3) above.

The path resistance value $R_{out1}$ of the first combination is calculated by substituting the transmission source-side surface temperature "0.218499" acquired for the component identifier "014" of the transmission source component, for $T_{in}$ in Equation (3), and further substituting the transmission destination-side surface temperature "59.04026" and the actual amount of heat transmitted "0.163086" acquired for the transmission destination ID "011", respectively for $T_{out1}$ and $Q_{out1}$.

Furthermore, the path resistance value $R_{out2}$ of the second combination is calculated by substituting the transmission source-side surface temperature "0.218499" for $T_{in}$ in Equation (3), and further substituting the transmission destination-side surface temperature "59.028473" and the actual amount of heat transmitted "0.016361" acquired for the transmission destination ID "016", respectively for $T_{out2}$ and $Q_{out2}$.

Furthermore, the path resistance value $R_{out3}$ of the third combination is calculated by substituting the transmission source-side surface temperature "0.218499" for $T_{in}$ in Equation (3), and further substituting the transmission destination-side surface temperature "59.100189" and the actual amount of heat transmitted "0.039029" acquired for the transmission destination ID "017", respectively for $T_{out3}$ and $Q_{out3}$.

Then, the calculated three path resistance values are substituted for Equation (4), so that a heat resistance value R of the component with "component ID" being "012" is acquired. It is assumed that the acquired heat resistance value R is "1.60". The unit is, for example, "° C./W". The acquired heat resistance value is stored in an unshown storage unit in association with the component ID "012". Note that this value of the heat resistance and the like are values provided for the sake of convenience of the description, and may not values accurately calculated using the values in FIG. 8 and the like. Note that the same is applied to the description below.

In a similar manner, heat resistances of components indicated by other "component ID" after "012", stored in the inter-component information, are acquired, and the acquired heat resistance values are stored in the unshown storage unit in association with "component ID".

Note that if the number of transmission source components is one and the number of transmission destination components is one, a heat resistance value of the acquisition object component may be acquired without calculating a path resistance value, by substituting the transmission source-side surface temperature of the acquisition object component and the like for Equation (1) above.

Furthermore, if the number of transmission source components is multiple, a heat resistance value may be acquired by calculating a path resistance value for each combination of a transmission source component and a transmission destination component using Equation (5) above, and then subtracting the path resistance value for the equation in Equation (6).

Furthermore, if the acquisition object component is a heat source, "maximum temperature" of the acquisition object component is acquired from the component temperature management table shown in FIG. 10, without detecting a transmission source component. Furthermore, a transmission destination component is detected, and a transmission destination-side surface temperature and an actual amount of heat transmitted are acquired for each detected transmission destination component. Then, if the number of transmission destination components is one, a heat resistance value is acquired by substituting the acquired values for Equation (2). Furthermore, if the number of transmission destination components is multiple, a heat resistance value of the component may be acquired by acquiring a path resistance value for each transmission destination component by substituting the "maximum temperature" instead of $T_{in}$ for Equation (3), and then substituting the obtained value for Equation (4).

For example, it is assumed that the resistance value acquiring unit 105 acquires the component ID "015" from the inter-component information. It is judged that this component has a heat source because the value of "heat source" in the component temperature management table shown in FIG. 10 is "1". Accordingly, the resistance value acquiring unit 105 acquires "59.283333", which is the value of "maximum temperature" corresponding to "015" of "component ID", from the component temperature management table. Furthermore, "011", "013", "014", "017", "018", and "019" are acquired as component identifiers of the transmission destination components, and, as described above, a transmission destination-side surface temperature and an actual amount of heat transmitted are acquired for each identifier. Then, the "maximum temperature" is substituted instead of $T_{in}$ for Equation (3), so that a path resistance value is acquired for each transmission destination component. Then, the acquired path resistance value is substituted for Equation (4), so that a heat resistance value is acquired for the component with "component ID" being "015".

In a manner as described above, the resistance value acquiring unit 105 acquires heat resistance values for all of "component ID" (excluding "011") contained in the inter-component information.

FIG. 12 is a heat resistance value management table for managing heat resistance values acquired and stored in an unshown storage unit by the resistance value acquiring unit 105. The heat resistance value management table has an attribute "component ID", which is a component identifier, and an attribute "heat resistance value", which is a heat resistance value acquired for a component.

For example, it is designated by the user or by default or the like that the components are not displayed as groups.

First, the display information generating unit 106 reads "012" of "component ID" and "014" of "contact component ID", from a first record from the top excluding records with either "component ID" or "contact component ID" being "011" in the inter-component information management table shown in FIG. 8, that is, from an eleventh record from the top in FIG. 8, and arranges nodes associated with these values, in a virtual two-dimensional plane. For example, the nodes are arranged adjacent to each other at intersecting points on a predesignated invisible grid or the like. For example, a grid is used in which multiple triangles are arranged such that their sides overlap each other. A node is, for example, an image having a predesignated shape, size, and color. For example, the shape is circular.

Then, the display information generating unit 106 connects the nodes with a line segment having an arrow at an end thereof. Note that an arrowhead of the arrow is provided on the side of the node associated with "component ID" if the value of "amount of heat transmitted" in the eleventh record is positive, and is provided on the side of the node associated with "contact component ID" if the sign is negative. In this example, the value of "amount of heat transmitted" in the eleventh record is positive, and, thus, the arrowhead is provided on the side of the node associated with the component ID "012". Furthermore, it is assumed that the line thickness increases continuously or stepwise according to the absolute value of "amount of heat transmitted". For example, the thickness is proportional to the absolute value of "amount of heat transmitted". Note that all lines may have the same thickness, and a value of "amount of heat transmitted" may be arranged near each line.

Furthermore, the display information generating unit 106 arranges a component identifier associated with each node, near that node. In this example, "component name" in FIG. 8 is arranged as the component identifier. For example, "h", which is "component name" corresponding to the component ID "012", is acquired from FIG. 8, and a character string such as "h" or "component name=h" is arranged near the node. Also, a character string such as "b" or "component name=b" is arranged near the node associated with the contact component ID "014".

Furthermore, the display information generating unit 106 acquires a heat resistance value of each component associated with a component identifier associated with the arranged node, from the heat resistance value management table in FIG. 12, and arranges the heat resistance value near the node as in the case of a component identifier. For example, "1.60", which is "heat resistance value" corresponding to the component ID "012", is acquired from the heat resistance value management table shown in FIG. 12, and a character string such as "1.60", "R=1.60", or "heat resistance value 1.60" is arranged near the arranged node associated with the component ID "012". Also for the node associated with "014" of "contact component ID", the heat resistance value "0.28" is acquired and arranged in a similar manner.

In a similar manner, a pair of components contained in other inter-component information is read, nodes associated with these components are arranged, and component names and heat resistance values associated with these nodes are arranged.

If one of the nodes associated with the acquired "component ID" and "contact component ID" has been already arranged, the other node that has not been arranged is arranged, a component name and a heat resistance value associated with that node are arranged, and the node that has been just arranged and the node that has been already arranged are connected to each other as described above by a line segment having an arrow.

For example, it is assumed that the display information generating unit 106 acquires "012" of "component ID" and "016" of "contact component ID", from a twelfth record from the top in the inter-component information management table. In this case, the node associated with the component identifier "012" has been already arranged, and, thus, only the node associated with the component identifier "016" is newly arranged. Since the value of "amount of heat transmitted" is negative, this node and the already arranged node associated with the component identifier "012", that is, the node with "component name" being "h" are connected to each other by a line segment having an arrow provided with an arrowhead on the side of the node associated with the component identifier "016". Furthermore, "0.42", which is "heat resistance value" corresponding to the component identifier "016", and "f", which is "component name" corresponding to the component identifier "016", are arranged near the node associated with the component identifier "016".

Furthermore, if the nodes respectively associated with "component ID" and "contact component ID" acquired from the inter-component information have been already arranged, arrangement and the like of the nodes are not performed.

In this example, the image of a node of a component that is a heat source, that is, a node with "component ID" being "015" is provided with a color different from that for other nodes.

Then, arrangement and the like of the nodes are performed for all pieces of inter-component information, so that display information for displaying a transmission path diagram is obtained.

The output unit 107 outputs the display information generated by the display information generating unit 106. For example, the display information is displayed on an unshown monitor.

Figure 13:
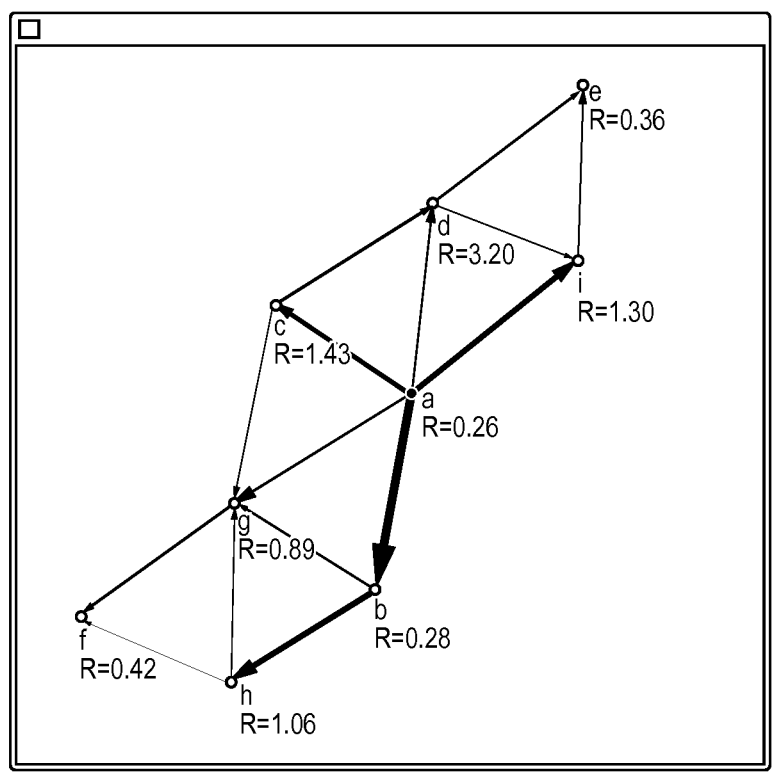
FIG. 13 is a diagram showing a display example according to the information processing apparatus in this Example.

FIG. 13 is a heat transmission path diagram displayed using the display information generated by the display information generating unit 106.

If a transmission path diagram is displayed in this manner, a heat resistance value is displayed at a node associated with each component, and, thus, the situation of each component on transmission paths can be easily seen.

Specific Example 2

In this example, after the transmission path diagram as shown in FIG. 13 is displayed, for example, the information processing apparatus 1 accepts an instruction to display components as groups, via an unshown accepting unit or the like, from the user or the like. The displaying as groups may be considered, for example, as displaying a transmission path diagram in which nodes of groups corresponding to the group management information and nodes of components belonging to no group are both arranged.

In this case, the resistance value acquiring unit 105 sequentially reads component identifiers having the same group identifier associated therewith, for each group identifier, from the group management table shown in FIG. 9, and acquires heat resistance for each group identifier, that is, for each group. In the case of group display, a component associated with no group identifier by the group management information is taken as a group in which the component identifier is the group identifier.

The resistance value acquiring unit 105 detects a first group ID "G1" from the group management information shown in FIG. 9.

Then, the resistance value acquiring unit 105 reads component IDs "014" and "015" associated with the group ID "G1" from the group management information, and judges whether or not either of them is a component identifier of a component that has a heat generating source. In this example, it is judged that the component indicated by the component ID "015" is a component identifier of a component that has a heat generating source.

Accordingly, the resistance value acquiring unit 105 sequentially reads component identifiers of components belonging to the group indicated by the group management information, detects all records (rows) with "component ID" matching one of the read component identifiers and the sign of "amount of heat transmitted" being negative, from the inter-component information management table shown in FIG. 8, and sequentially acquires values of "contact component ID" of the detected records. Then, overlapping identifiers except for one are deleted from among the acquired component identifiers. Furthermore, those with the component ID "014" or "015" are also deleted. The resistance value acquiring unit 105 acquires component identifiers remaining after this processing, as component identifiers of transmission destination components from the first group.

Next, the resistance value acquiring unit 105 calculates the total amount $Q_{in\_total}$ of heat transmitted from the acquired transmission destination components to the components forming the first group. Then, a path resistance value is acquired for each component identifier of the transmission destination acquired by the resistance value acquiring unit 105.

The resistance value acquiring unit 105 acquires the total of the actual amounts of heat transmitted from the components forming the first group to a component indicated by a component identifier of a transmission destination, using Equation (11), as the amount of heat transmitted from the first group to this transmission destination component. Furthermore, using Equation (12), a weighted average of surface temperatures of components, from among the components forming the first group, in contact with the transmission destination component is calculated using an amount of heat as weight. This weighted average is regarded as a surface temperature of the first group at a portion thereof in contact with the transmission destination component.

Then, the acquired values are substituted for Equation (7), so that a path resistance value of the path indicated by the component identifier of the transmission destination is acquired.

A similar process is performed also on component identifiers of other transmission destination components detected above, so that path resistance values thereof are acquired.

Then, a heat resistance value of the first group including a component that has a heat generating source is acquired, by substituting the acquired path resistance values for Equation (8). The acquired heat resistance value is stored in an unshown storage unit or the like in association with the first group ID "G1".

Next, the resistance value acquiring unit 105 detects a second group ID "G2" from the group management information shown in FIG. 9. Then, the resistance value acquiring unit 105 reads component IDs "016" and "017" associated with the group ID "G2" from the group management information, and judges whether or not either of them is a component identifier of a component that has a heat generating source. In this example, it is judged that none of them is a component identifier of a component that has a heat generating source.

Accordingly, the resistance value acquiring unit 105 sequentially reads the component IDs "016" and "017", detects all records (rows) with "component ID" matching one of the read component identifiers and the sign of "amount of heat transmitted" being positive, from the inter-component information management table shown in FIG. 8, and sequentially acquires values of "contact component ID" of the detected records. Then, overlapping identifiers except for one are deleted from among the acquired component identifiers. Furthermore, those with the component ID "016" or "017" are also deleted. The resistance value acquiring unit 105 acquires component identifiers remaining after this processing, as component identifiers of transmission source components to the second group.

Furthermore, in a similar manner, the resistance value acquiring unit 105 sequentially reads component identifiers of components belonging to the group indicated by the group management information, detects all records (rows) with "component ID" matching the read component identifiers and the sign of "amount of heat transmitted" being negative, from the inter-component information management table shown in FIG. 8, and sequentially acquires values of "contact component ID" of the detected records as component identifiers of transmission destination components from the second group. Then, overlapping identifiers except for one are deleted from among the acquired component identifiers. Furthermore, those with the component ID "016" or "017" are also deleted. The resistance value acquiring unit 105 acquires component identifiers remaining after this processing, as component identifiers of transmission destination components from the second group.

Next, the resistance value acquiring unit 105 calculates the total amount $Q_{in\_total}$ of heat transmitted from the acquired transmission source components to the components forming the second group. Then, a path resistance value is acquired for each combination of a component identifier of one transmission source component and a component identifier of one transmission destination component acquired by the resistance value acquiring unit 105.

First, using Equation (9), the resistance value acquiring unit 105 acquires the total of the actual amounts of heat transmitted from a component indicated by a component identifier of a transmission source component forming one combination of a component identifier of a transmission source component and a component identifier of a transmission destination component to the components forming the second group, as the amount of heat transmitted from that transmission source component to the second group. Furthermore, using Equation (10), a weighted average of surface temperatures of components, from among the components forming the second group, in contact with the transmission source component is calculated using an amount of heat as weight. This weighted average is regarded as a surface temperature of the second group at a portion thereof in contact with the transmission source component.

Furthermore, using Equation (11), the resistance value acquiring unit 105 acquires the total of the actual amounts of heat transmitted from the components forming the second group to a component indicated by a component identifier of a transmission destination component forming one combination of a component identifier of a transmission source component and a component identifier of a transmission destination component, as the amount of heat transmitted from the second group to that transmission destination component. Furthermore, using Equation (12), a weighted average of surface temperatures of components, from among the components forming the second group, in contact with the transmission destination component is calculated using an amount of heat as weight. This weighted average is regarded as a surface temperature of the second group at a portion thereof in contact with the transmission destination component.

Then, the acquired values are substituted for Equation (5), so that a path resistance value of the path indicated by the combination of a component identifier of a transmission source component and a component identifier of a transmission destination component is acquired.

A similar process is performed also on other combinations of a component identifier of a transmission source component and a component identifier of a transmission destination component detected above, so that path resistance values thereof are acquired.

Then, a heat resistance value of the second group is acquired, by substituting the acquired path resistance values for Equation (13). The acquired heat resistance value is stored in an unshown storage unit or the like in association with the second group ID "G2".

A similar process is performed also on other combinations of a component identifier of a transmission source component and a component identifier of a transmission destination component, so that path resistance values thereof are acquired.

Then, a heat resistance value of the second group including a component that does not have a heat generating source is acquired, by substituting the acquired path resistance values for Equation (13). The acquired heat resistance value is stored in an unshown storage unit or the like in association with the second group ID "G2".

A similar process is performed also on the group indicated by another group ID "G3", and component IDs "012" and "013". Note that a heat resistance value acquired in a state where a component associated with no group by the group management information is taken as a group is stored in an unshown storage unit in association with a component identifier.

FIG. 14 is a group heat resistance management table for managing heat resistance values acquired for respective groups by the resistance value acquiring unit 105. The group heat resistance management table has attributes "group ID" and "heat resistance value". A record having a heat resistance value acquired in a state where a component associated with no group by the group management information is taken as a group is provided with the attribute "group ID" in which the component identifier of the component forming that group is stored. The "heat resistance value" is a heat resistance value of each group.

Next, the display information generating unit 106 judges whether or not there is, in the group management table in FIG. 9, a group identifier associated with a value of "component ID" or a value of "contact component ID" of all records excluding records with either "component ID" or "contact component ID" being "011" in the inter-component information management table shown in FIG. 8, and acquires an inter-group information management table in which such a component identifier is replaced by a group identifier associated therewith. Note that "component ID" associated with no group identifier is not replaced.

FIG. 15 is a diagram showing an inter-group information management table.

The display information generating unit 106 detects records having the same "component ID" and the same "contact component ID" in the inter-group information management table in FIG. 15, sums the values of "amount of heat transmitted" of the detected records, and accumulates the obtained value in an unshown storage unit in association with the "component ID" and the "contact component ID".

FIG. 16 is a group heat transmission amount management table for associating and managing the summed amounts of heat transmitted, which are accumulated by the display information generating unit 106. The group heat transmission amount management table has attributes "group ID", "contact group ID", and "summed amount of heat transmitted". The "group ID" is a group identifier. The "contact group ID" is an identifier of a component group in contact with a component group indicated by the "group ID" associated therewith. The "summed amount of heat transmitted" is an amount obtained by summing the amounts of heat transmitted as described above. In the group heat transmission amount management table, a record having values of "group ID" and "contact group ID" that are respectively the same as values of "contact group ID" and "group ID" of another record may be deleted.

Next, the display information generating unit 106 reads "012" of "group ID", from a first record in the group heat transmission amount management table shown in FIG. 16. Since the read "group ID" is a component identifier, a node associated with "012" is arranged in a virtual two-dimensional plane as in the case of not performing group display. Whether or not an identifier is a group identifier is judged, for example, based on whether or not the value of "group ID" begins with "G". Furthermore, a heat resistance value, a component name, and the like associated with this node are also acquired from the inter-component information management table shown in FIG. 8 or the like, and are arranged as described above. Note that, if a node associated with the same "group ID" has been already arranged, arrangement is not performed.

In a similar manner, the display information generating unit 106 reads "G1" of "contact group ID" from the first record, and arranges a node associated with "contact group ID" as in the case of arranging a node of a component identifier. In this example, since "contact group ID" is a group identifier, an image having a shape (e.g., quadrangular shape) different from that of a node associated with a component identifier is used as the image of this node. Furthermore, the display information generating unit 106 arranges the group ID "G1" near the node. Furthermore, the display information generating unit 106 acquires the heat resistance value "0.297329" associated with the group ID "G1", from the group heat resistance value management table shown in FIG. 14. Then, a character string indicating the acquired heat resistance value, for example, a character string "R=0.297329" is arranged near the node associated with the group identifier. Note that, if a node associated with the same "contact group ID" has been already arranged, arrangement is not performed.

Furthermore, the display information generating unit 106 connects the arranged node associated with the component ID "012" and the node associated with the group ID "G1", with a line segment having an arrow. The display information generating unit 106 determines where to arrange the arrowhead of the line segment, according to the sign of "summed amount of heat transmitted" of the first record in the group heat transmission amount management table. In this example, since the value of "amount of heat transmitted" is positive, the display information generating unit 106 arranges the arrowhead on the side of the node associated with "012" of "group ID". If the value is negative, the display information generating unit 106 arranges the arrowhead on the side of the node associated with "G1" of "contact group ID". Although all lines connecting nodes have the same thickness in this example, the line thickness may be a thickness that is in accordance with the value of "summed amount of heat transmitted", for example, may increase continuously or stepwise according to an increase in the value.

The display information generating unit 106 performs a similar process on all records in the second and its following rows in the group heat transmission amount management table shown in FIG. 16, thereby acquiring display information for displaying a transmission path diagram in which components are displayed as groups.

Note that, if one of the nodes associated with the acquired "group ID" and "contact group ID" has been already arranged, the other node that has not been arranged is arranged, a component name or a group identifier and a heat resistance value associated with that node are arranged, and the node that has been just arranged and the node that has been already arranged are connected to each other as described above by a line segment having an arrow.

Furthermore, if the nodes respectively associated with "group ID" and "contact group ID" acquired from the inter-component information have been already arranged, arrangement and the like of the nodes are not performed.

Then, the output unit 107 outputs the display information generated by the display information generating unit 106. For example, the display information is displayed on an unshown monitor.

Figure 17:
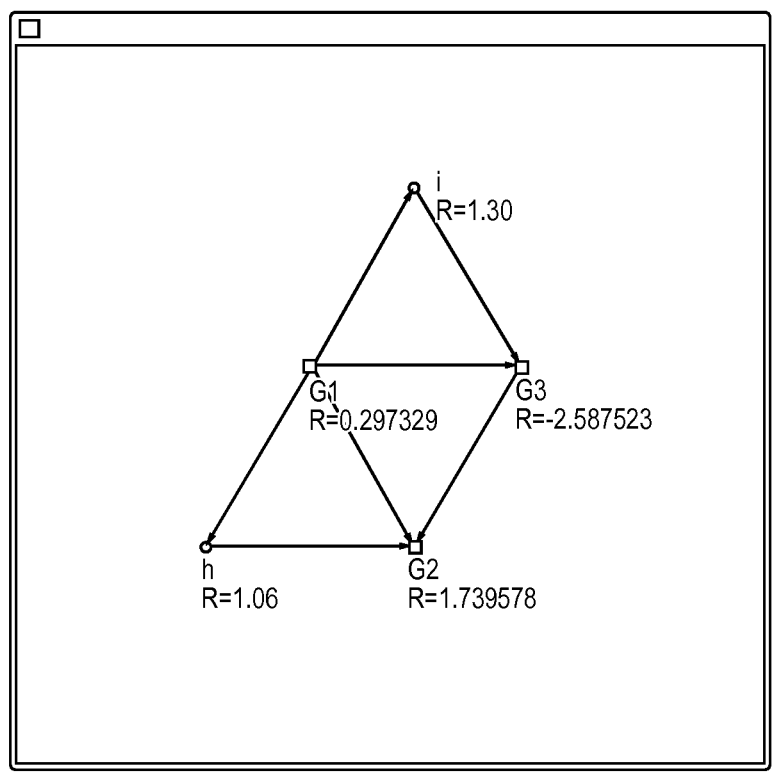
FIG. 17 is a diagram showing a display example according to the information processing apparatus in this Example.

FIG. 17 is a heat transmission path diagram in which components are displayed as groups, displayed using the display information generated by the display information generating unit 106. If a transmission path diagram is displayed in this manner, heat transmission paths between component groups can be easily seen, and the outline of heat transmission can be easily seen.

Note that a transmission path diagram without group display as shown in FIG. 13 and a transmission path diagram with group display as shown in FIG. 17 may be switched and displayed as appropriate according to an instruction from the user or the like. In this case, the display information generating unit 106 and the like may generate in advance display information for displaying both transmission path diagrams, or may generate, after the switching instruction, display information for displaying a transmission path diagram to which switching has been instructed.

Specific Example 3

In this example, for example, the information processing apparatus 1 accepts an instruction to display a transmission path diagram showing part of transmission paths, via an unshown accepting unit or the like, from the user. For example, it is assumed that an instruction is given to display a transmission path diagram showing only components other than a component with which the largest number of other components perform heat transmission, among the components excluding the component 11.

In this case, the display information generating unit 106 counts, for example, for each value of "component ID", the number of records having the same value of "component ID" and different values of "contact component ID" in the inter-component information management table shown in FIG. 8, and acquires the value of "component ID" (excluding the component ID "011" of the component 11) having the largest count value. For example, in FIG. 8, the counted number of records with "component ID" being "017" and having different values of "contact component ID" is "5", which is larger than the counted number for the other "component ID". Accordingly, the display information generating unit 106 generates display information not having the node associated with the component ID "017", that is, not having the node of the component g. In order to generate display information not having the node with the component ID "017", for example, it is sufficient not to arrange the node of the component with "component ID" or "contact component ID" being "017" as in the case of not arranging the node with the component ID "011".

Figure 18:
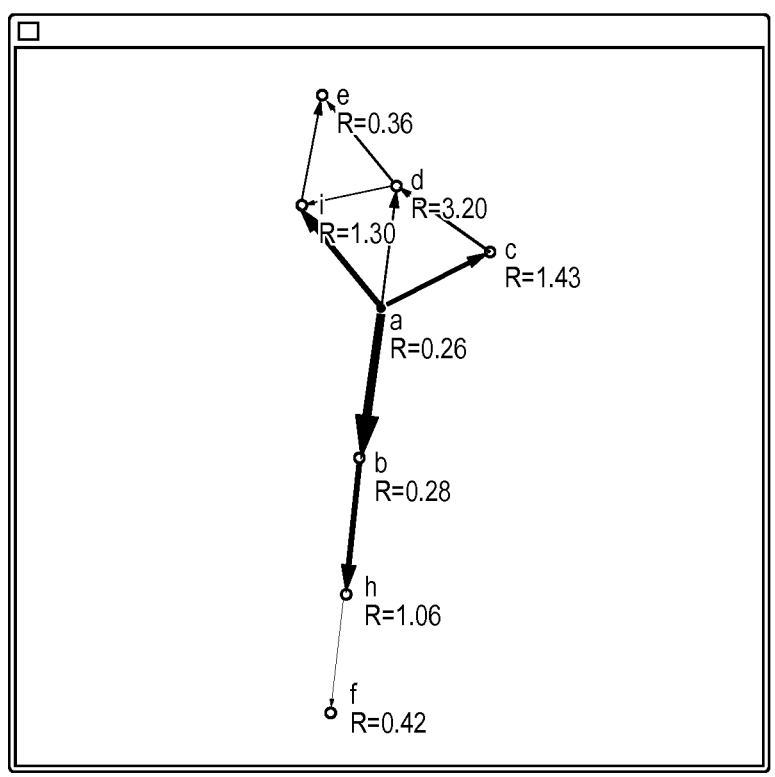
FIG. 18 is a diagram showing a display example according to the information processing apparatus in this Example.

FIG. 18 is a transmission path diagram displayed using the thus generated display information. If a transmission path diagram is displayed in this manner, only a necessary transmission path can be easily seen.

Specific Example 4

For example, the information processing apparatus 1 accepts an instruction to display a transmission path diagram in which nodes associated with components are arranged in a coordinate system having two axes representing a component temperature and a component heat resistance value, via an unshown accepting unit or the like, from the user or the like.

In this case, in the case of arranging nodes associated with component identifiers contained in the inter-component information as described above, first, the display information generating unit 106 acquires a component temperature and a heat resistance value associated with each component identifier that is to be arranged. For example, in the case of arranging a node associated with "012" of "component ID" acquired from the inter-component information management table shown in FIG. 8, the component temperature "59.072472" associated with the component ID "012" is acquired from the component temperature management table shown in FIG. 10, and the heat resistance value "1.60" associated with the component ID "012 is acquired from the heat resistance value management table shown in FIG. 12.

Then, the display information generating unit 106 arranges the node in a coordinate system where an x axis represents a heat resistance value and a y axis represents a component temperature, at a position with the heat resistance value "1.60" as the x coordinate value and the component temperature "59.072472" as the y coordinate value.

In a similar manner, the display information generating unit 106 arranges other nodes and connects nodes, thereby generating display information for displaying a transmission path diagram in which nodes associated with components are arranged in a coordinate system having two axes representing a component temperature and a component heat resistance value.

Figure 19:
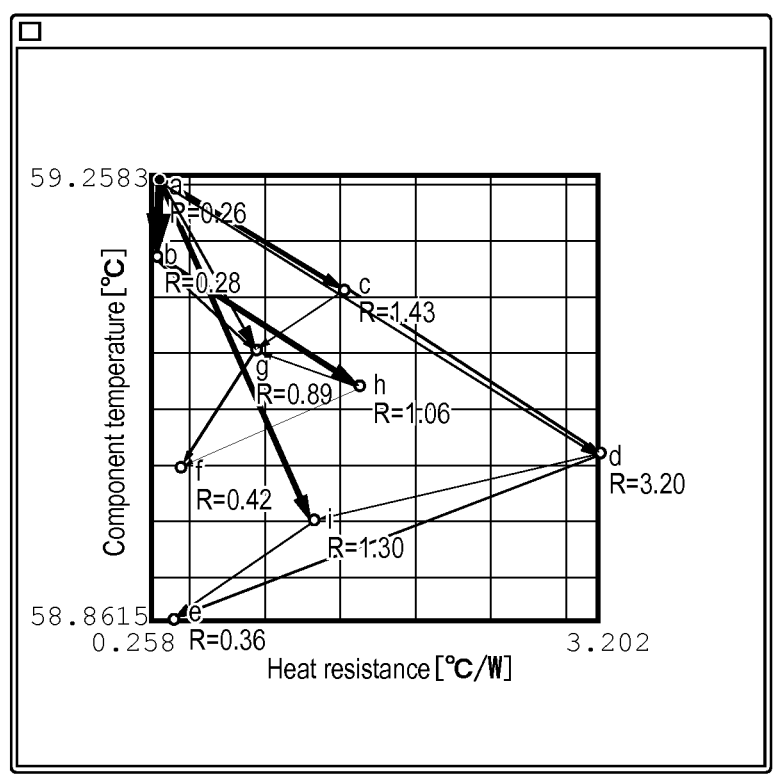
FIG. 19 is a diagram showing a display example according to the information processing apparatus in this Example.

FIG. 19 is a diagram showing a display example of a transmission path diagram in which nodes associated with components are arranged in a coordinate system having two axes representing a component temperature and a component heat resistance value.

Specific Example 5

For example, the information processing apparatus 1 accepts an instruction to display a transmission path diagram in which nodes associated with components are arranged in a coordinate system having two axes representing a component temperature and a component surface area, via an unshown accepting unit or the like, from the user or the like.

FIG. 20 is a diagram showing a component size management table for managing component size information stored in the component size information storage unit 103. The component size management table has attributes "component ID", "volume", and "surface area". The "component ID" corresponds to "component ID" in the inter-component information management table. The "volume" is volume information of a component indicated by "component ID", and the unit therefor is, for example, $cm^3$. Furthermore, the "surface area" is surface area information of a component indicated by "component ID", and the unit therefor is, for example, $cm^2$. It is assumed that the attribute values of "volume", "surface area", and the like are, for example, attribute values acquired from design data for components, for example, data acquired using CAD data, mesh data generated using the CAD data, or the like.

In this case, in the case of arranging nodes associated with component identifiers contained in the inter-component information as described above, first, the display information generating unit 106 acquires a component temperature and a surface area associated with each component identifier that is to be arranged. For example, in the case of arranging a node associated with "012" of "component ID" acquired from the inter-component information management table shown in FIG. 8, the component temperature "59.072472" associated with the component ID "012" is acquired from the component temperature management table shown in FIG. 10, and the surface area "5.00001" associated with the component ID "012" is acquired from the component size information management table shown in FIG. 20.

Then, the display information generating unit 106 arranges the node in a coordinate system where an x axis represents a surface area and a y axis represents a component temperature, at a position with the surface area "5.00001" as the x coordinate value and the component temperature "59.072472" as the y coordinate value.

In a similar manner, the display information generating unit 106 arranges other nodes and connects nodes, thereby generating display information for displaying a transmission path diagram in which nodes associated with components are arranged in a coordinate system having two axes representing a component temperature and a component surface area.

Figure 21:
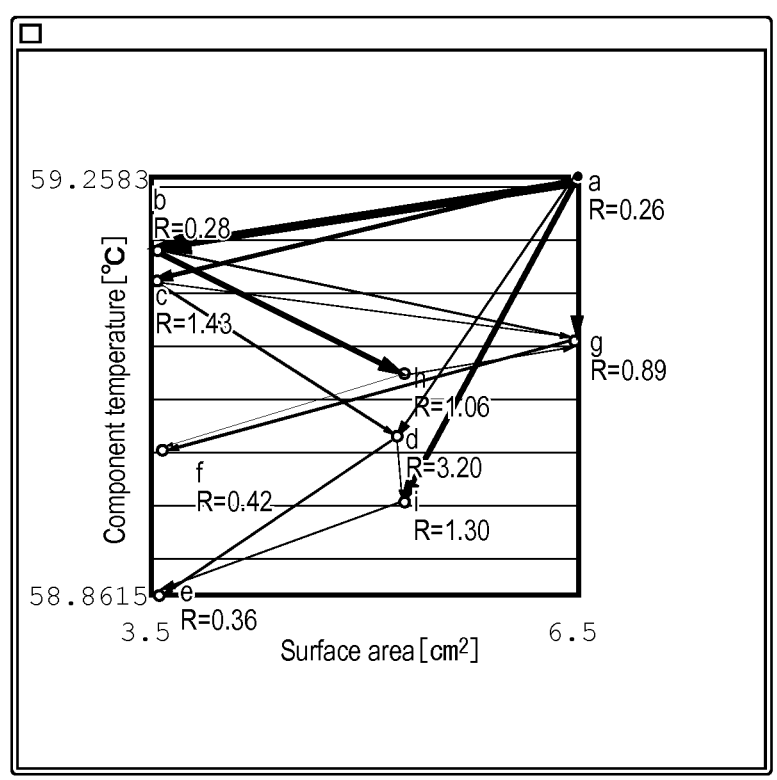
FIG. 21 is a diagram showing a display example according to the information processing apparatus in this Example.

FIG. 21 is a diagram showing a display example of a transmission path diagram in which nodes associated with components are arranged in a coordinate system having two axes representing a component temperature and a component surface area.

Specific Example 6

Furthermore, if an instruction is accepted to display a transmission path diagram in which nodes associated with components are arranged in a coordinate system having two axes representing a component temperature and a component volume, it is sufficient to perform the above-described processing while using the volume information in the component size information management table instead of the surface area information in the component size information management table.

Figure 22:
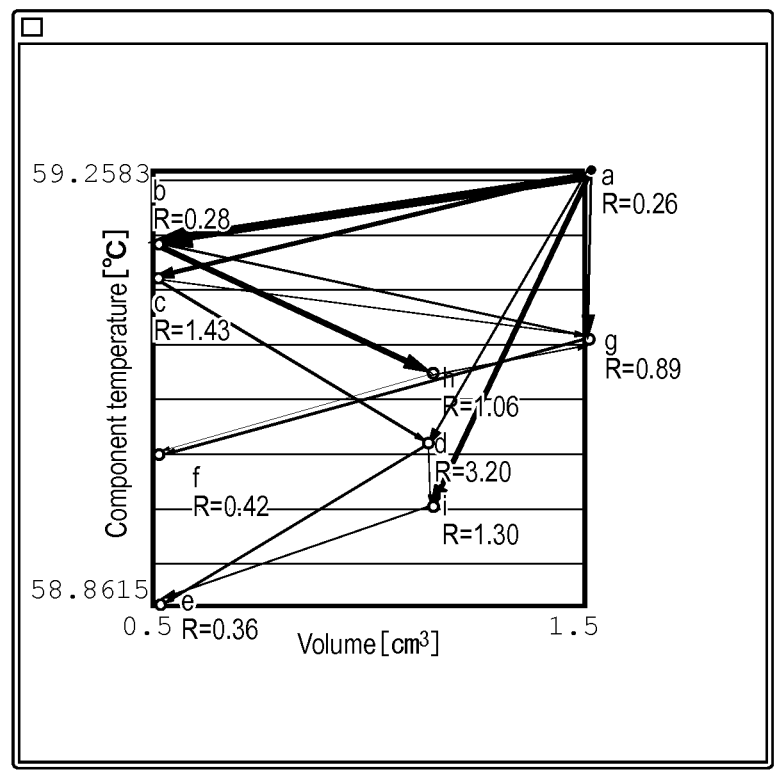
FIG. 22 is a diagram showing a display example according to the information processing apparatus in this Example.

FIG. 22 is a diagram showing a display example of a transmission path diagram in which nodes associated with components are arranged in a coordinate system having two axes representing a component temperature and a component volume.

Specific Example 7

The display information generating unit 106 may detect a component having a high heat resistance value using the heat resistance value management table shown in FIG. 12 in the transmission path diagram shown in FIG. 13 and other transmission path diagrams such as those shown in FIGS. 17, 18, 19, 21, and 22, and generate display information for a transmission path diagram in which a node associated with the detected component can be identified from other nodes. For example, the display information generating unit 106 may detect a component having a heat resistance value higher than a threshold value designated by the user or the like, and outputs a transmission path diagram in which a node associated with that component can be identified from other nodes, for example, in which an image of the node has a shape (e.g., star shape) different from that of other nodes. For example, in the case of arranging a node associated with each component identifier, the display information generating unit 106 judges whether or not a heat resistance value associated with that component identifier is higher than a predesignated threshold value. If the value is higher than the threshold value, an image having a shape different from that of other nodes is arranged, and, if not, an image having the same shape as that of other nodes is arranged.

For example, in the case of arranging a node associated with the component identifier "012", if the threshold value designated by the user is "1.5", the display information generating unit 106 acquires the heat resistance value "1.60" associated with the component identifier "012" from the heat resistance value management table in FIG. 12, and judges whether or not the acquired heat resistance value "1.60" is higher than the threshold value "1.5". Since the value is higher than a threshold value in this example, this node is arranged as an image in the shape of a star.

Furthermore, regarding another component, a heat resistance value associated with the component identifier "019" is "3.20", which is higher than the threshold value, and, thus, an image in the shape of a star is arranged as this node.

Ordinary circular images are arranged for all of other component.

Figure 23:
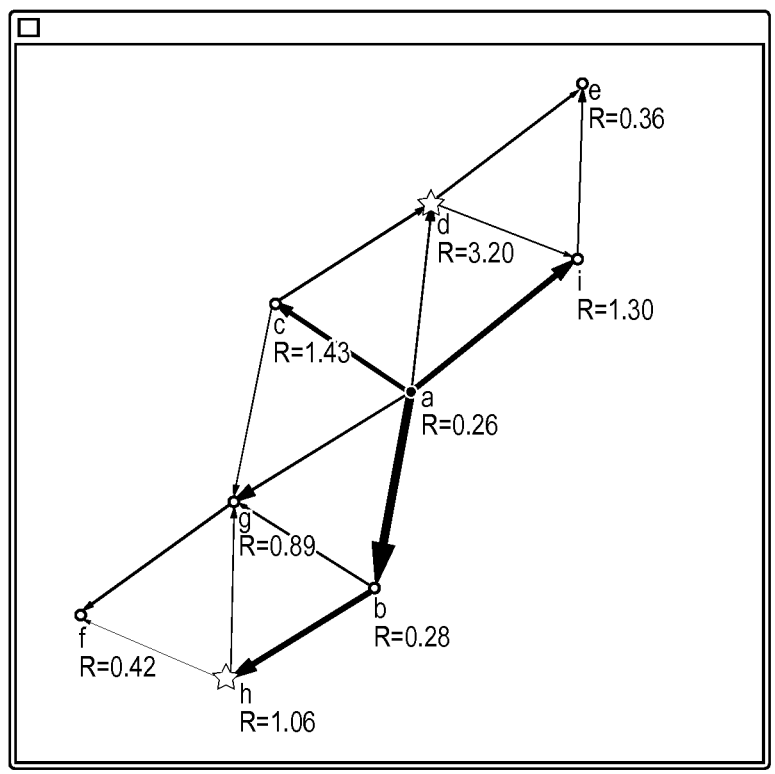
FIG. 23 is a diagram showing a display example according to the information processing apparatus in this Example.

FIG. 23 is a transmission path diagram in which a node having a heat resistance value higher than the threshold can be identified from other nodes. This diagram is the same as FIG. 13, except that the node with the component name "h" associated with the component identifier "012" and the node with the component name "d" associated with the component identifier "019" are displayed in a different manner.

Whether or not to perform such node display may be switched as appropriate according to an instruction from the user.

Specific Example 8

The display information generating unit 106 may generate display information for a transmission path diagram in which, in the transmission path diagram shown in FIG. 13 and other transmission path diagrams, a line connecting nodes associated with two or more components between which a large physical quantity is transmitted has an appearance identifiable from lines connecting other components.

For example, in the case of connecting, with a line or the like, nodes associated with two component identifiers contained in one piece of inter-component information, that is, in one record in the inter-component information management table shown in FIG. 8, the display information generating unit 106 judges whether or not the absolute value of "amount of heat transmitted" of this inter-component information is larger than a threshold value designated by the user or the like. If the value is larger than the threshold value, this line connecting the nodes is set such that it has an identifiable appearance.

For example, in the case of connecting, with a line, the node associated with the component ID "012" and the node associated with the contact component ID "014" contained in the eleventh record from the top in the inter-component information management table shown in FIG. 8, the display information generating unit 106 reads the value "0.218499" of "amount of heat transmitted" in this record, and judges whether or not the absolute value thereof is larger than a threshold value (e.g., "2") designated by the user. If the value is larger than the threshold value, the display information generating unit 106 connects these nodes with a line with hatching, in a manner different from that for other nodes, and, if not, connects these nodes with a line without hatching, in a similar manner for other nodes.

The display information generating unit 106 performs a similar process also on connection of other nodes.

Figure 24:
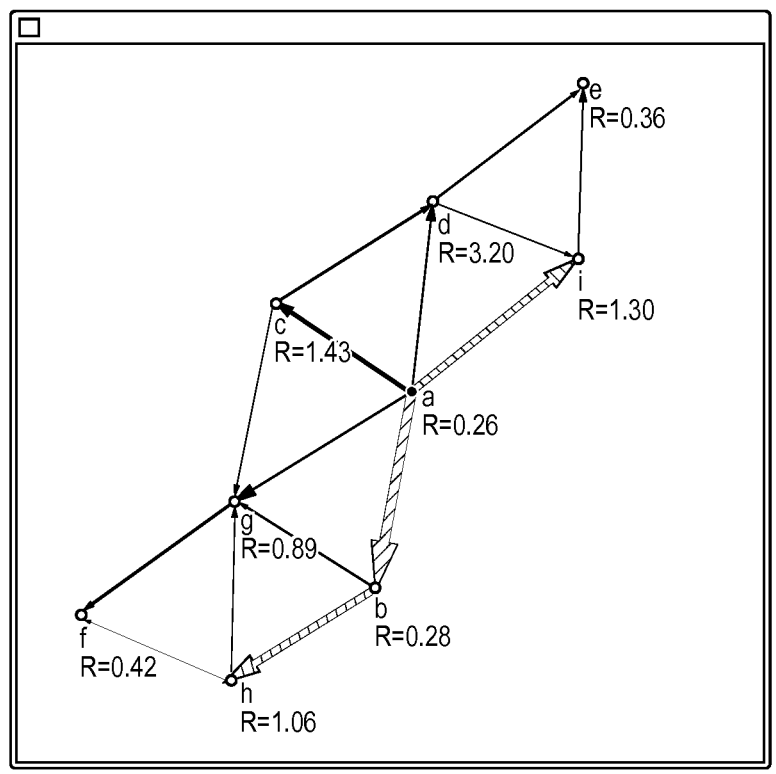
FIG. 24 is a diagram showing a display example according to the information processing apparatus in this Example.

FIG. 24 is a transmission path diagram in which a line connecting nodes associated with components between which a large physical quantity is transmitted has an identifiable appearance. This diagram is the same as FIG. 13, except that lines respectively connecting the components with the component names "a" and "i", the components with the component names "a" and "b", and the components with the component names "b" and "h" are displayed in a different manner.

Specific Example 9

The display information generating unit 106 may detect a component having low heat resistance and not connected to any of the two or more components between which a large physical quantity is transmitted, and generate display information for a transmission path diagram in which a node associated with the detected component can be identified from other nodes.

For example, the display information generating unit 106 detects a record having "amount of heat transmitted" of at least a first threshold value in the inter-component information management table shown in FIG. 8, acquires component identifiers of the detected record, that is, "component ID" and "contact component ID", and accumulates the acquired identifiers in an unshown storage unit or the like. For example, if the first threshold value is "0.3", the display information generating unit 106 acquires the component identifiers "014" and "015" from the inter-component information management table shown in FIG. 8.

Then, as described above, in the case of arranging a node associated with a component identifier contained in the inter-component information, the display information generating unit 106 judges whether or not this component identifier matches any of the component identifiers of the detected records having a value of at least the first threshold. If the identifier matches, the display information generating unit 106 arranges this node in a manner similar to that for other ordinary nodes. If not, the display information generating unit 106 acquires heat resistance of the component indicated by the component identifier associated with that node, from the heat resistance management table shown in FIG. 12, and judges whether or not the acquired heat resistance value is lower than a second threshold value designated by the user or by default or the like. If the value is not lower than the second threshold value, the display information generating unit 106 arranges the node as it is in a manner similar to that for other ordinary nodes. If the value is lower than the second threshold value, the display information generating unit 106 judges whether or not the component indicated by the component identifier is connected to any of the components indicated by the acquired nodes having a value of at least the first threshold. Specifically, the display information generating unit 106 acquires "contact component ID" of all records with "component ID" matching this component identifier, and judges whether or not any of the acquired "contact component ID" matches any of the component identifiers of the detected records having a value of at least the first threshold. If the acquired "contact component ID" matches any of them, the component indicated by the component identifier is connected to any of the two or more components between which a large physical quantity is transmitted, and, thus, the node associated with this component identifier is arranged in a manner similar to that for other ordinary nodes. If the acquired "contact component ID" matches none of them, this node is displayed in a manner different from that for other nodes.

For example, in the case of arranging the node associated with the component identifier "016", first, the display information generating unit 106 judges that this node is not associated with either of the component identifiers "014" and "015". Furthermore, if the second threshold value is "0.4", since the heat resistance value of the component associated with the component identifier "016" is "0.42" according to the heat resistance value management table shown in FIG. 12, which is higher than"0.4", and, thus, this node is arranged as an ordinary node.

Furthermore, for example, in the case of arranging the node associated with the component identifier "020", first, the display information generating unit 106 judges that this node is not associated with either of the component identifiers "014" and "015". Furthermore, if the second threshold value is "0.4", since the heat resistance value of the component associated with the component identifier "020" is "0.36" according to the heat resistance value management table shown in FIG. 12, and, thus, it is judged that this value is lower than the second threshold value. Accordingly, the display information generating unit 106 searches for a record with "component ID" being "020" from the inter-component information management table shown in FIG. 8, acquires "contact component ID" of all of the detected records, and judges whether or not any of the acquired "contact component ID" contains either of the component identifiers "014" and "015". If the acquired "contact component ID" contains either of them, this node is arranged as an ordinary node. If not, for example, this node is arranged as an image enclosed by a double circle, which is in a manner different from that for other nodes.

Figure 25:
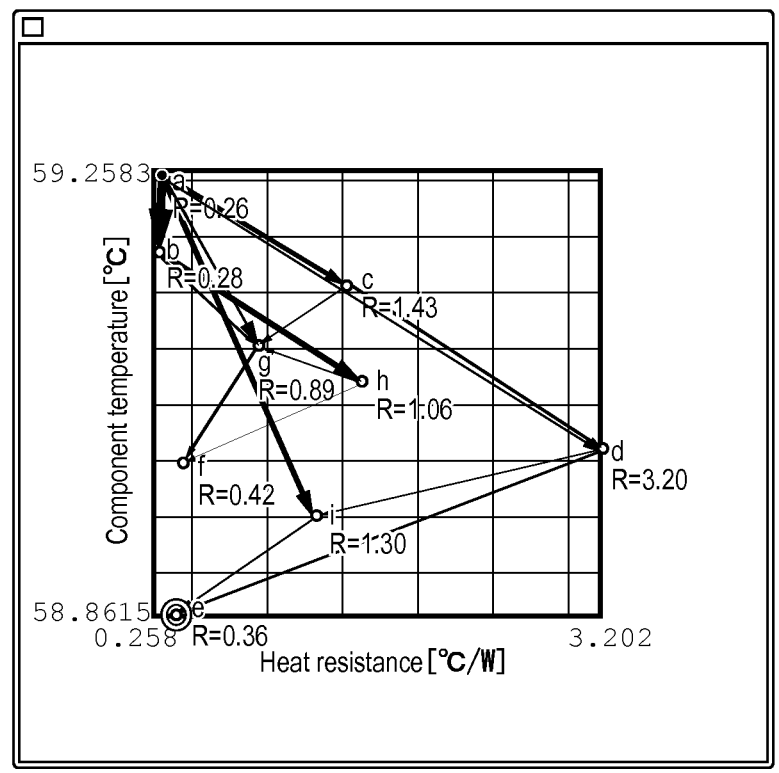
FIG. 25 is a diagram showing a display example according to the information processing apparatus in this Example.

FIG. 25 is a transmission path diagram displayed using the thus generated display information. This diagram is displayed such that it is possible to identify a component having a low heat resistance value and not connected to any of the two or more components between which a large physical quantity is transmitted, in a transmission path diagram as in FIG. 19 in which nodes associated with components are arranged in a coordinate system having two axes representing a component temperature and a component heat resistance value. If a transmission path diagram is displayed in this manner, a component having a low heat resistance value and currently not effectively used can be displayed in a visually recognizable manner to the user and the like.

Note that, in the foregoing specific examples, the cases were described in which the physical quantity is heat and the state value is a surface temperature of a component, but the present invention can be applied to a combination of another physical quantity and another state value, and, for example, can be applied to a case in which the physical quantity is current and the state value is a potential of a component as described above.

Furthermore, in the foregoing specific examples, the cases were described in which the inter-component information is configured by one piece of information, but the present invention can be applied to a case in which the inter-component information may be configured by multiple pieces of information. For example, the inter-component information is configured by, instead of information in one inter-component information management table in the foregoing specific examples, information managed by a management table having "component ID", "contact component ID", and "surface temperature", information managed by a management table having "component ID", "contact component ID", and "amount of heat transmitted", and information managed by a management table having "component ID" and "component name".

Furthermore, in the inter-component information storage unit 101, the component temperature information or the component size information may be further stored. Furthermore, the inter-component information, the component temperature information, and the component size information may be configured by one piece of information. In such a case, the component temperature management information storage unit 102 and the component size information storage unit 103 may be omitted.

Furthermore, the data structure of the inter-component information or the group management information is not limited to those described in the foregoing specific examples, and any data structure can be used. For example, the data structure of the inter-component information or the group management information may be, for example, information in an XML format or the like.

It will be appreciated that the processing in Specific Examples 3 to 9 described above can be applied to a case in which group display in Specific Example 2 is performed. In this case, for example, a component in Specific Examples 3 to 9 may be considered as appropriate as a component group or the like in Specific Example 2.

As described above, according to the Example, if display information for displaying a transmission path diagram in which information indicating a resistance value is arranged at a node indicating a component is output, a transmission situation of a physical quantity with the component on a physical quantity transmission path can be properly displayed due to the information indicating the resistance value arranged at the node.

Furthermore, according to the Example, if information indicating a resistance value is arranged at a node of a group, the situation of that group, that is, the heat resistance of that group on a transmission path can be easily seen.

In the foregoing Example, each processing (each function) may be realized as integrated processing using a single apparatus (system), or may be realized as distributed processing using multiple apparatuses.

Furthermore, in the foregoing Example, information relating to the processing performed by each constituent element, for example, information that is to be accepted, acquired, selected, produced, transmitted, or received by each constituent element, information such as a threshold value, a numerical expression, or an address used by each constituent element in the processing and the like may be retained in an unshown storage medium temporarily or for a long period of time even if not specified in the description above. Furthermore, information may be accumulated in the unshown storage medium by each constituent element or by an unshown accumulating unit. Furthermore, information may be read from the unshown storage medium by each constituent element or by an unshown reading unit.

Furthermore, in the foregoing Example, the case was described in which the information processing apparatus is a stand-alone apparatus, but the information processing apparatus may be either a stand-alone apparatus or a server apparatus in a server-client system. In the latter case, the output unit and the accepting unit use a communication line to accept input or output a screen.

Furthermore, in the foregoing Example, each constituent element may be configured by dedicated hardware, or, alternatively, constituent elements that can be realized by software may be realized by executing a program. For example, each constituent element may be realized by a program execution unit such as a CPU reading and executing a software program stored in a storage medium such as a hard disk or a semiconductor memory. At the time of executing the program, the program execution unit may execute the program while accessing a storage unit (e.g., a storage medium such as a hard disk or a memory).

The software that realizes the information processing apparatus in the foregoing Example may be the following sort of program. Specifically, this program is a program used in a state where a computer can access an inter-component information storage unit in which multiple pieces of inter-component information, each of which is information having component identifiers respectively indicating two components, a value of a physical quantity that is transmitted between the two components, and a state value, with respect to the two components, that changes according to transmission of the physical quantity, are stored, the program causing the computer to function as: a resistance value acquiring unit that acquires a resistance value of at least one component corresponding to the physical quantity, using the inter-component information; a display information generating unit that generates, using the inter-component information, display information for displaying a transmission path diagram, which is an image showing a transmission path having nodes respectively associated with at least two components, and is an image in which information indicating the resistance value acquired by the resistance value acquiring unit is arranged at a node associated with at least one component from which the resistance value has been acquired by the resistance value acquiring unit; and an output unit that outputs the display information generated by the display information generating unit.

Furthermore, in the program, the functions realized by the program do not include functions that can be realized only by hardware. For example, functions that can be realized only by hardware, such as a modem or an interface card, in an acquiring unit that acquires information or an output unit that outputs information are not included in the functions realized by the above-described program.

Furthermore, the computer that executes this program may be a single computer, or may be multiple computers. That is to say, centralized processing may be performed, or distributed processing may be performed.

Figure 26:
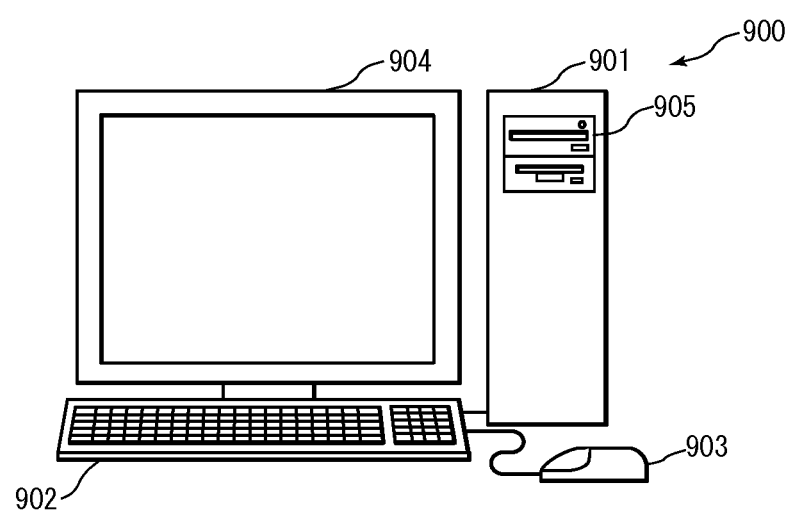
FIG. 26 is a view showing an exemplary appearance of a computer system in the Example of the present invention.

FIG. 26 is a schematic view showing an exemplary appearance of a computer that executes the program described above to realize the information processing apparatus in the foregoing Example. The foregoing Example may be realized using computer hardware and computer programs executed thereon.

In FIG. 26, a computer system 900 is provided with a computer 901 including a compact disk read only memory (CD-ROM) drive 905, a keyboard 902, a mouse 903, and a monitor 904.

Figure 27:
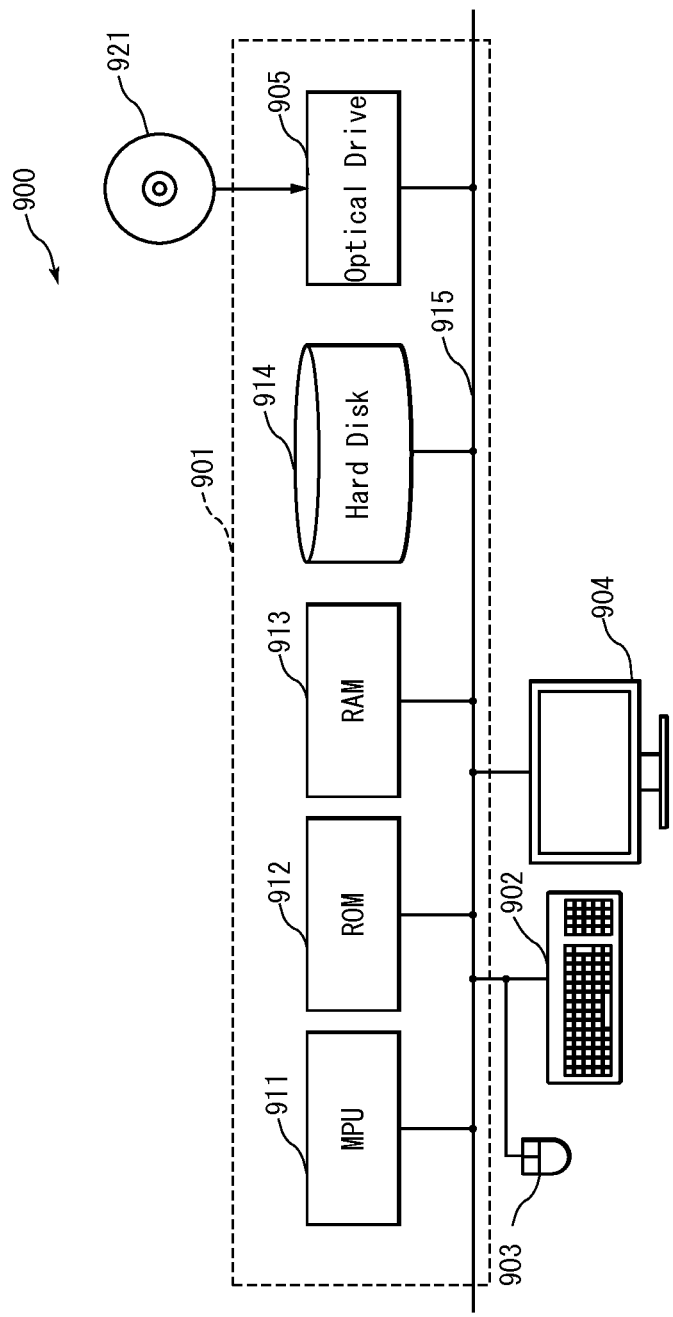
FIG. 27 is a diagram showing an exemplary configuration of the computer system in this Example.

FIG. 27 is a diagram showing an internal configuration of the computer system 900. In FIG. 27, the computer 901 is provided with, in addition to the CD-ROM drive 905, a micro processing unit (MPU) 911, a ROM 912 in which a program such as a boot up program is to be stored, a random access memory (RAM) 913 that is connected to the MPU 911 and in which a command of an application program is temporarily stored, and a temporary storage area is to be provided, a hard disk 914 in which an application program, a system program, and data are stored, and a bus 915 that connects the MPU 911, the ROM 912, and the like. Note that the computer 901 may include an unshown network card for providing a connection to a LAN.

The program for causing the computer system 900 to execute the functions of the information processing apparatus and the like in the foregoing Example may be stored in a CD-ROM 921 that is inserted into the CD-ROM drive 905, and be transmitted to the hard disk 914. Alternatively, the program may be transmitted via an unshown network to the computer 901 and stored in the hard disk 914. At the time of execution, the program is loaded into the RAM 913. The program may be loaded from the CD-ROM 921, or directly from a network.

The program does not necessarily have to include, for example, an operating system (OS) or a third party program to cause the computer 901 to execute the functions of the information processing apparatus in the foregoing Example. The program may only include a command portion to call an appropriate function (module) in a controlled mode and obtain desired results. The manner in which the computer system 900 operates is well known, and, thus, a detailed description thereof has been omitted.

The present invention is not limited to the Example set forth herein. Various modifications are possible within the scope of the present invention.

As described above, the information processing apparatus and the like according to the present invention are suitable as an apparatus and the like for outputting information indicating a transmission situation of a physical quantity, and are particularly useful as an apparatus and the like for outputting information for displaying a transmission path diagram showing a transmission situation of a physical quantity.

What is claimed is:
1. An information processing apparatus, comprising:
an inter-component information storage storing inter-component information including component identifiers respectively indicating two components, a value of a physical quantity that is transmitted between the two components, and a state value, with respect to the two components, that changes according to transmission of the physical quantity; and
at least one of non-transitory computer-readable storage medium in which a program is stored or a processor acting as the program, wherein the program causing a computer to function as:
a resistance value acquirer acquiring a resistance value of at least one component corresponding to the physical quantity, using the inter-component information;
a display information generator generating, using the inter-component information, display information displaying a transmission path diagram, which is an image showing a transmission path of the physical quantity between at least two components having nodes respectively associated with at least two components that are plotted in a rectangular coordinate system having two axes representing physical properties that not associated with the spatial relationship between the components, and is an image in which information indicating the resistance value acquired by the resistance value acquirer is arranged at a node associated with at least one component from which the resistance value has been acquired; and an output outputting the display information generated by the display information generator.

2. The information processing apparatus according to claim 1, wherein the physical quantity is heat, the state value is a surface temperature of a component, and the resistance value is a heat resistance value of a component.

3. The information processing apparatus according to claim 2, further comprising:

a component temperature management information storage storing at least one piece of component temperature management information, which has at least one component identifier contained in the inter-component information, and component temperature information indicating a temperature of a component indicated by the component identifier, wherein two axes represent a component temperature and a component heat resistance value, at a position specified with a temperature of that component indicated by the component temperature information acquired for that component and a heat resistance value acquired for that component by the resistance value acquirer.

4. The information processing apparatus according to claim 2, further comprising:

a component temperature management information storage in which at least one piece of component temperature management information, which has at least one component identifier contained in the inter-component information, and component temperature information indicating a temperature of a component indicated by the component identifier, is stored; and a component size information storage in which at least one piece of component size information, which has at least one component identifier contained in the inter-component information, and at least one of surface area information indicating a surface area and volume information indicating a volume of a component indicated by the component identifier, is stored;

wherein the display information generator acquires component temperature information corresponding to each of at least three components associated with nodes on the transmission path, from the component temperature management information storage, further acquires component size information corresponding to each of at least two components forming nodes on the transmission path, from the component size information storage, and generates display information for a transmission path diagram in which a node associated with each component is arranged, in a coordinate system having two axes representing a component temperature and a component surface area or volume, at a position specified with a temperature of that component indicated by the component temperature information acquired for that component and a surface area or volume of that component indicated by the component size information acquired for that component.

5. The information processing apparatus according to claim 2, wherein the display information generator detects a component having a high heat resistance value using heat resistance values of components associated with nodes on the transmission path acquired by the resistance value acquirer, and generates display information for a transmission path diagram in which a node associated with the detected component is visually distinguished from other nodes.

6. The information processing apparatus according to claim 1, wherein the physical quantity is current,
the state value is a potential of a component, and
the resistance value is an electrical resistance value of a component.

7. The information processing apparatus according to claim 1, wherein the display information generator generates display information for a transmission path diagram in which each node on the transmission path is arranged, and two nodes respectively associated with two components between which the physical quantity is transmitted are connected to each other by a line.

8. The information processing apparatus according to claim 7, wherein the display information generator detects at least two components between which the transmitted physical quantity exceeds a threshold and generates display information for a transmission path diagram in which a line connecting nodes associated with the at least two detected components has an appearance distinguishable from lines connecting other components.

9. The information processing apparatus according to claim 8, wherein the display information generator detects a component having a resistance value that is below a threshold, and not connected to any of the detected components between which the transmitted physical quantity exceeds a threshold, and generates display information for a transmission path diagram in which the node associated with the detected component is visually distinguishable from other nodes.

10. The information processing apparatus according to claim 7, wherein the display information generator detects the direction the physical quantity is transmitted between at least two components and generates display information for a transmission path diagram in which the detected direction is indicated by a vector between nodes associated with the at least two components.

11. The information processing apparatus according to claim 7, wherein the display information generator detects sets of components between which the transmitted physical quantity exceeds a threshold, and generates display information for a transmission path diagram in which only the transmission paths between the detected component are displayed as a line connecting nodes associated with the detected components.

12. The information processing apparatus according to claim 1, further comprising:

a group management information storage in which at least one piece of group management information, which has a component identifier of at least one component belonging to one group, is stored, wherein the resistance value acquirer acquires a resistance value of a group, for at least one component belonging to one group indicated by the group management information, using the inter-component information, and the display information generator generates display information displaying a transmission path diagram in which a transmission path is shown where a node each indicating at least one group indicated by the group management information is arranged instead of a node of at least one component belonging to the group, and in which information indicating the resistance value acquired for each of at least one group on the transmission path by the resistance value acquirer is arranged at a node associated with that group.

13. An information processing method performed using: an inter-component information storage in which multiple pieces of inter-component information, each of which is information having component identifiers respectively indicating two components, a value of a physical quantity that is transmitted between the two components, and a state value, with respect to the two components, that changes according to transmission of the physical quantity, are stored; a resistance value acquirer; a display information generator; and an output, the method comprising:

a resistance value acquiring step of the resistance value acquirer acquiring a resistance value of at least one component corresponding to the physical quantity, using the inter-component information;

a display information generating step of the display information generator generating, using the inter-component information, display information displaying a transmission path diagram, which is an image showing a transmission path of the physical quantity between at least two components having nodes respectively associated with at least two components that are plotted in a rectangular coordinate system having two axes representing physical properties that not associated with the spatial relationship between the components, and is an image in which information indicating the resistance value acquired by the resistance value acquirer is arranged at a node associated with at least one component from which the resistance value has been acquired; and an output step of the output outputting the display information generated in the display information generating step.

14. A non-transitory computer-readable storage medium in which a program is stored, the program being used in a state where a computer can access an inter-component information storage in which multiple pieces of inter-component information, each of which is information having component identifiers respectively indicating two components, a value of a physical quantity that is transmitted between the two components, and a state value, with respect to the two components, that changes according to transmission of the physical quantity, are stored, the program causing the computer to function as:

a resistance value acquirer acquiring a resistance value of at least one component corresponding to the physical quantity, using the inter-component information;

a display information generator generating, using the inter-component information, display information displaying a transmission path diagram, which is an image showing a transmission path of the physical quantity between at least two components having nodes respectively associated with at least two components that are plotted in a rectangular coordinate system having two axes representing physical properties that not associated with the spatial relationship between the components, and is an image in which information indicating the resistance value acquired by the resistance value acquirer is arranged at a node associated with at least one component from which the resistance value has been acquired by the resistance value acquirer; and an output outputting the display information generated by the display information generator.

15. An information processing apparatus, comprising:

an inter-component information storage storing inter-component information including component identifiers respectively indicating two components, a value of a physical quantity that is transmitted between the two components, and a state value, with respect to the two components, that changes according to transmission of the physical quantity; and at least one of non-transitory computer-readable storage medium in which a program is stored or a processor acting as the program, wherein the program causing a computer to function as:

a resistance value acquirer acquiring a resistance value of at least one component corresponding to the physical quantity, using the inter-component information;

a display information generator generating, using the inter-component information, display information displaying a transmission path diagram, wherein the transmission path diagram is an image showing:

nodes respectively associated with at least two components that are plotted in a rectangular coordinate system having two axes representing physical properties that not associated with the spatial relationship between the components, a line connecting the nodes associated with a transmission path of the physical quantity between the at least two components if the transmitted physical quantity exceeds a threshold, and information indicating the resistance value acquired by the resistance value acquirer is arranged at a node associated with at least one component from which the resistance value has been acquired; and an output outputting the display information generated by the display information generator.

* * * * *